(12) United States Patent
Park

(10) Patent No.: US 7,859,642 B2
(45) Date of Patent: Dec. 28, 2010

(54) APPARATUS AND METHOD FOR EXPOSING EDGE OF SUBSTRATE

(75) Inventor: Jong Ho Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 760 days.

(21) Appl. No.: 11/455,433

(22) Filed: Jun. 19, 2006

(65) Prior Publication Data

US 2007/0153246 A1    Jul. 5, 2007

(30) Foreign Application Priority Data

Dec. 29, 2005   (KR) ...................... 10-2005-0133112

(51) Int. Cl.
*G03B 27/54* (2006.01)
(52) U.S. Cl. .............................. 355/53; 355/70; 355/72; 356/509
(58) Field of Classification Search ....................... None
See application file for complete search history.

(56) References Cited

U.S. PATENT DOCUMENTS 6,496,249 B2 * 12/2002 Nishimura et al. ............ 355/73
2005/0221740 A1 * 10/2005 Kim et al. .................... 451/402

* cited by examiner

*Primary Examiner*—Daborah Chacko Davis
(74) *Attorney, Agent, or Firm*—Brinks Hofer Gilson & Lione

(57) ABSTRACT

An apparatus and method for exposing an edge of a substrate are disclosed, in which an exposure time period for exposing the edge of the substrate is reduced. The apparatus for exposing an edge of a substrate includes a loading unit loading the substrate, and an edge exposure unit exposing the edge of the substrate loaded by the loading unit using each of a long side exposure unit and a short side exposure unit. Therefore, since the edge of the substrate is exposed using each of the long side exposure unit and the short side exposure unit, it is possible to reduce the edge exposure time period, thereby improving productivity. In addition, since no rotation of the substrate is required, it is possible to reduce the size of the apparatus. Moreover, since the apparatus is provided in an in-line type, it is possible to easily draw the substrate using a conveyer.

4 Claims, 22 Drawing Sheets

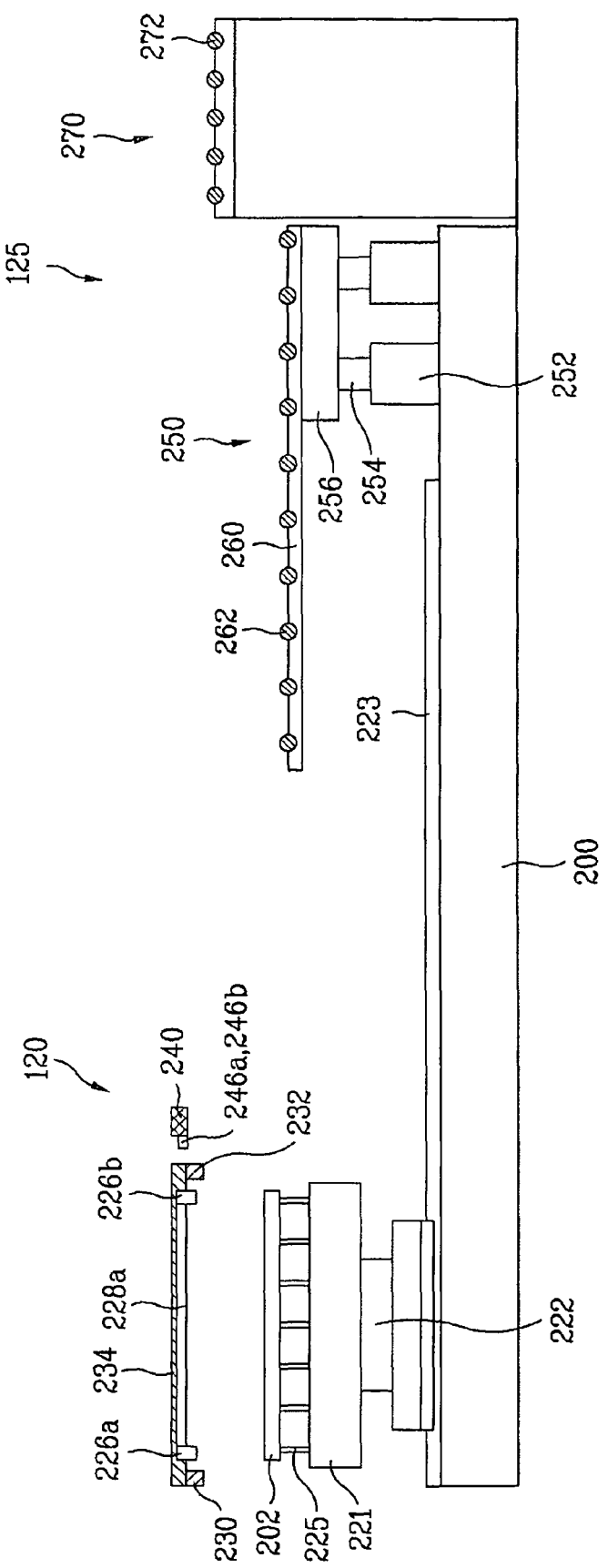

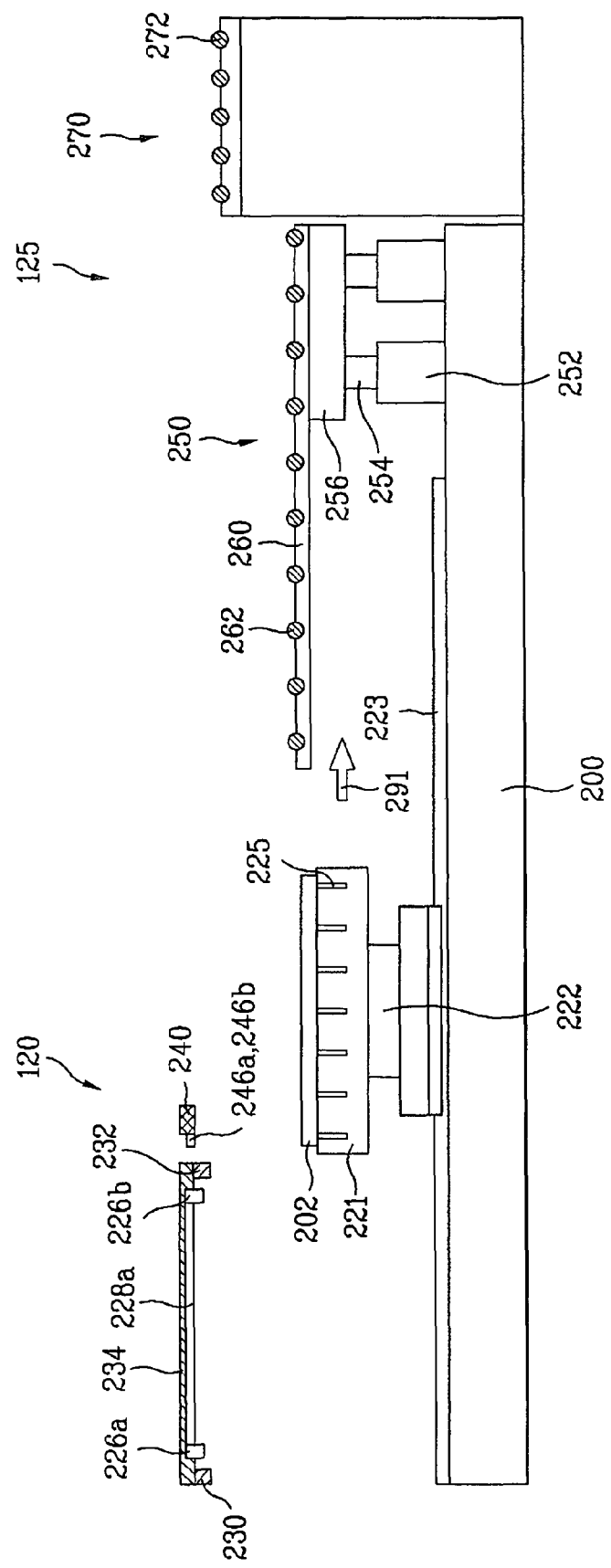

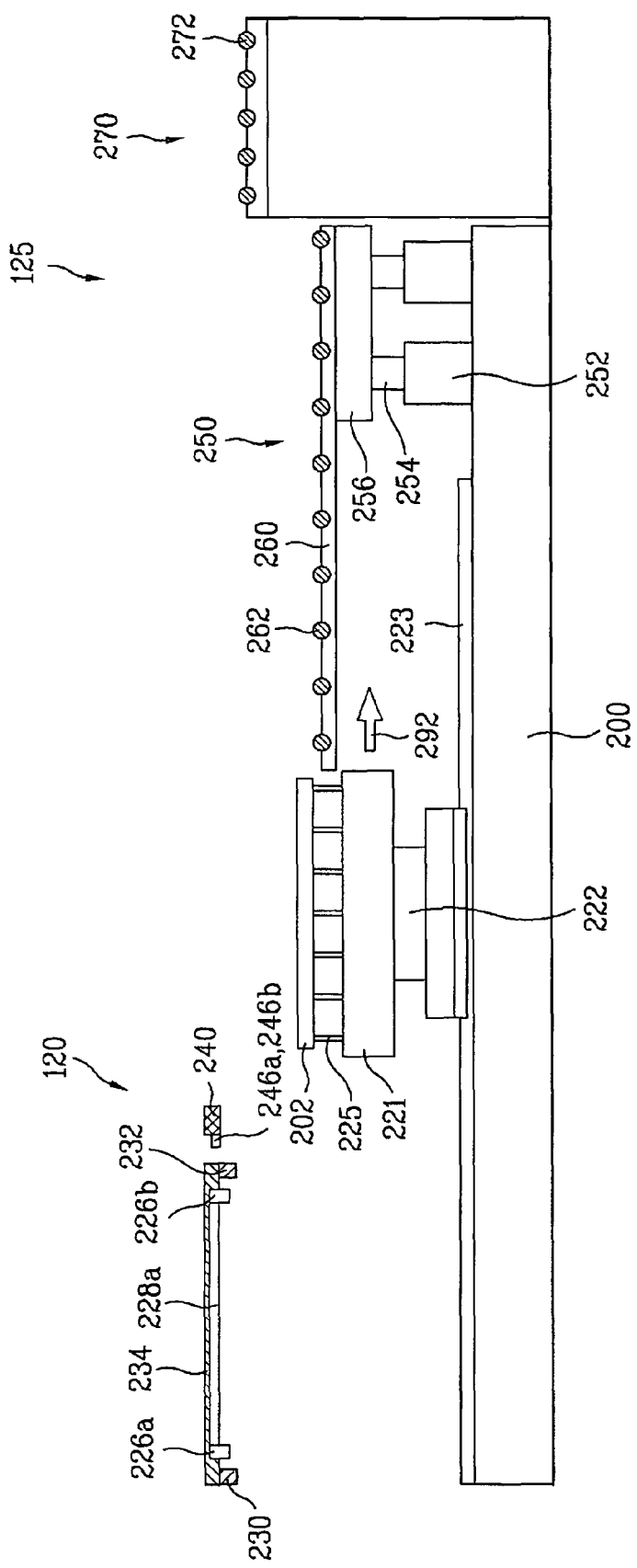

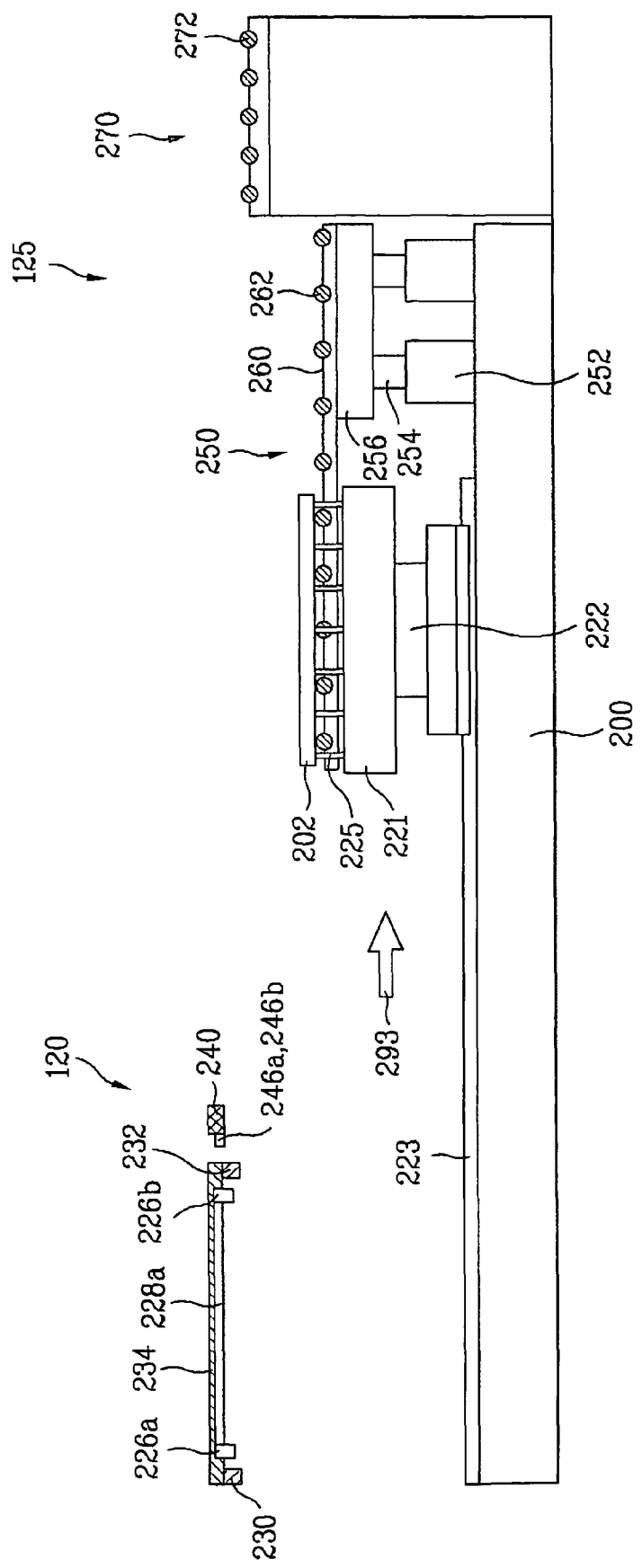

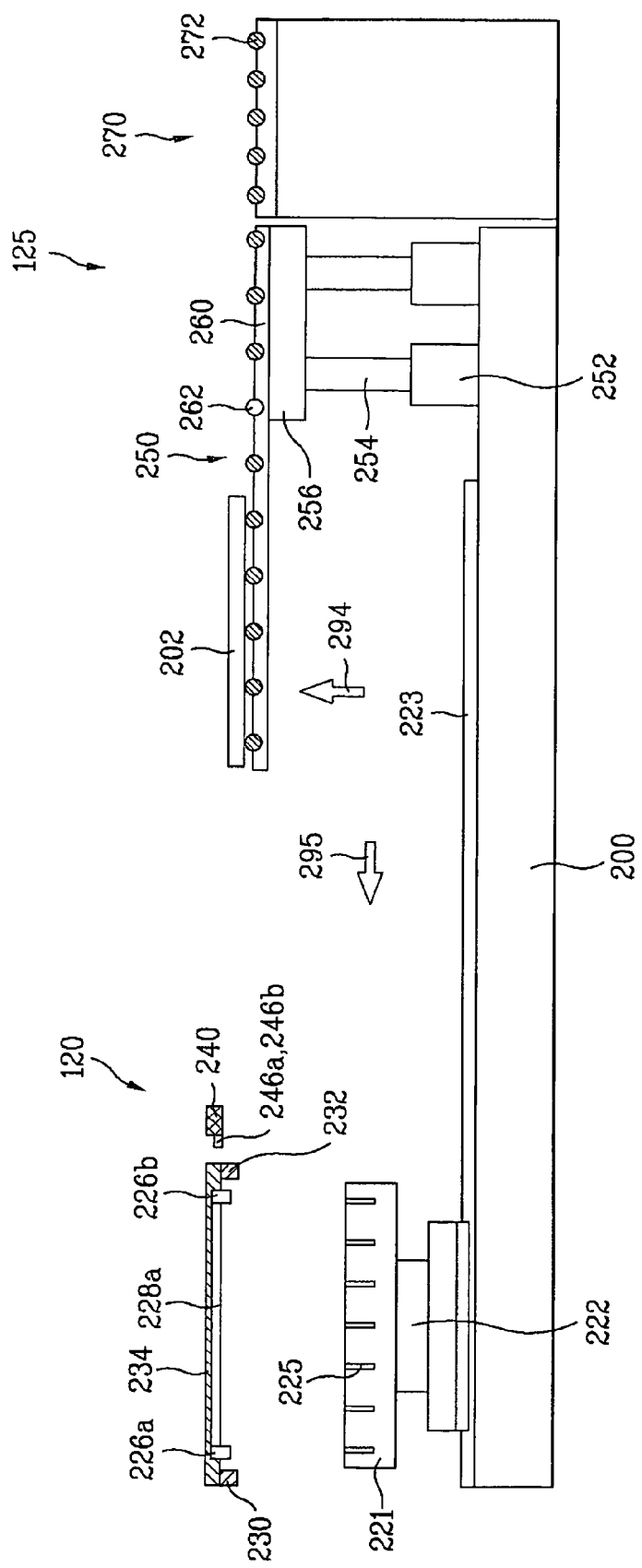

APPARATUS AND METHOD FOR EXPOSING EDGE OF SUBSTRATE

FIELD OF THE INVENTION

This application claims the benefit of Korean Patent Application No. P05-133112, filed on Dec. 29, 2005, which is incorporated by reference herein.

BACKGROUND OF THE INVENTION

The present invention relates to an apparatus and method for exposing an edge of a substrate to manufacture a flat display device, and more particularly, to an apparatus and method for exposing an edge of a substrate, in which an exposure time period for exposing the edge of the substrate is reduced.

Generally, a photolithography process is used to pattern a substrate in a process of manufacturing a semiconductor device or a flat display device.

The photolithography process includes a deposition process of depositing a photoresist on a substrate, an exposure process of exposing the photoresist deposited on the substrate, and a development process of developing the exposed substrate.

The exposure process is to selectively expose the photoresist deposited on the substrate using a mask.

Meanwhile, a process defect occurs due to foreign materials generated by peeling at the edge of the substrate during movement, exposure or development of the substrate. To prevent such peeling at the edge of the substrate, an edge exposure process is performed before the exposure process to remove the edge of the substrate at a certain width.

FIG. 1 is a block diagram illustrating a related art apparatus for exposing an edge of a substrate.

Referring to FIG. 1, the related art apparatus for exposing an edge of a substrate includes a loading/unloading unit 10 loading and unloading the substrate, and an edge exposure unit 20 exposing the edge of the substrate loaded by the loading/unloading unit 10.

The loading/unloading unit 10 loads the substrate externally deposited with a photoresist into the edge exposure unit 20 using a robot arm. Also, the loading/unloading unit 10 unloads the substrate exposed by the edge exposure unit 20 from the edge exposure unit 20 using the robot arm.

The edge exposure unit 20 exposes the edge, i.e., long and short sides, of the substrate loaded by the loading/unloading unit 10 at a certain width.

FIG. 2 illustrates the related art edge exposure unit 20 shown in FIG. 1.

Referring to FIG. 2 in connection with FIG. 1, the related art edge exposure unit 20 includes a stage 21 supporting the substrate deposited with the photoresist, a driving shaft 22 moving the stage 21 in a first direction (X axis) and rotating the stage 21, a rail 23 guiding the driving shaft 22 to move the driving shaft 22 to the first direction, and an exposure unit provided in the rail 23 to expose the edge of the substrate.

The stage 21 includes a plurality of lift pins 25 supporting and fixing the substrate loaded from the loading/unloading unit 10. The lift pins 25 are ascended and descended by a driving device (not shown) to adsorb the substrate under the vacuum state.

The driving shaft 22 is linked to the driving device to move the stage 21 in the first direction (X axis) along the rail 23. Also, the driving shaft 22 is rotated by the driving device to rotate the stage 21.

The rail 23 guides the driving shaft 22 to move the driving shaft 22 to the first direction (X axis).

The exposure unit includes a support bar 24 arranged to vertically cross the rail 23, first and second optical systems 26a and 26b arranged in parallel at a side of the support bar 24, and a distance controller 28 controlling the distance between the first and second optical systems 26a and 26b.

The support bar 24 is fixed to the rail 23 to vertically cross the rail 23.

Each of the first and second optical systems 26a and 26b are spaced apart from each other to correspond to the distance between the long sides or the short sides of the substrate. Each of the first and second optical systems 26a and 26b irradiates light toward the long sides or the short sides of the substrate to expose the edge of the substrate.

The distance controller 28 controls the distance between the first and second optical systems 26a and 26b to correspond to the distance between the long sides or the short sides of the substrate.

FIGS. 3A to 3G are sectional views illustrating exposure process steps of exposing the edge of the substrate using the related art edge exposure unit 20.

The exposure process steps of exposing the edge of the substrate according to the related art will be described as follows.

First, as shown in FIG. 3A, the substrate 2 deposited with the photoresist is loaded, as shown by arrow 30, onto the stage 21 of the home position by the robot arm of the loading/unloading unit 10. If the robot arm of the loading/unloading unit 10 on which the substrate is mounted is positioned on the stage 21, the lift pins 25 are ascended by the driving device to lift the substrate 2 mounted on the robot arm. If the substrate 2 is lifted at a certain height by the lift pins 25, the robot arm returns to the loading/unloading unit 10. At this time, the distance between the first and second optical systems 26a and 26b is set by the distance controller 28 to correspond to the distance between the long sides of the substrate 2.

When the robot arm is taken out from the stage 21, the lift pins 25 descend and are fixed to the surface of the stage 21 as shown in FIG. 3B.

Subsequently, as shown in FIG. 3C, the driving shaft 22 moves to the first direction (X axis) along the rail 23 so that the stage 21 moves, as shown by arrow 31, to the exposure unit. When the substrate 2 moves near the exposure unit, the first and second optical systems 26a and 26b irradiate light toward both edges 29a of the long sides of the substrate 2 to expose the long sides of the substrate 2. At this time, the first and second optical systems 26a and 26b may be driven by a sensing signal of a sensor (not shown) that senses the position of the substrate 2.

Subsequently, as shown in FIG. 3D, when the long sides of the substrate 2 are completely exposed, the driving shaft 22 is clockwise rotated, as shown by arrow 32, at an angle of 90° as shown in FIG. 3D. At this time, the distance between the first and second optical systems 26a and 26b is set, as shown by arrow 33, by the distance controller 28 to correspond to the distance between the short sides of the substrate 2.

Next, as shown in FIG. 3E, when the substrate 2 is completely rotated, the driving shaft 22 moves to the first direction (X axis) along the rail 23 so that the stage 21 moves to the home position. If the substrate 2, which is moving to the home position, moves near the exposure unit, the first and second optical systems 26a and 26b irradiate light toward both edges 29b of the short sides of the substrate 2 to expose the short sides of the substrate 2.

Subsequently, as shown in FIG. 3F, when the short sides of the substrate 2 are completely exposed, the driving shaft 22 is clockwise rotated, as shown by arrow 34, at an angle of 900 as shown in FIG. 3G. At this time, the distance between the first and second optical systems 26a and 26b is set by the distance controller 28 to correspond to the distance between the long sides of the substrate 2.

Then, when rotation of the substrate 2 is completed, the substrate 2 whose long and short sides have completely been exposed is ascended at a certain height by the lift pins 25. The robot arm of the loading/unloading unit 10 is inserted between the ascended substrate 2 and the stage 21. Subsequently, the lift pins 25 are descended into the stage 21 so that the substrate 2 is mounted on the robot arm and thus unloaded from the loading/unloading unit 10.

Consequently, in the related art apparatus and method for exposing the edge of the substrate, as shown in FIGS. 3A to 3G, the edge of the substrate 2 is exposed in the order of loading of the substrate 2, movement of the stage 21 and exposure of the long sides, rotation of the stage 21, movement of the stage 21 and exposure of the short sides, rotation of the stage 21, and unloading of the substrate 2.

However, the related art apparatus and method for exposing the edge of the substrate have several problems.

Since both a reciprocating movement time period of the stage 21 to the first direction (X axis) and a rotational time period of the stage 21 are required, the process time of exposing the edge of the substrate 2 increases.

Further, since the substrate 2 is unloaded through a port after being loaded into the port, the process time of exposing the edge of the substrate 2 increases due to a standby time period of the substrate 2.

Moreover, since the stage 21 should be rotated, the size of the apparatus increases.

SUMMARY OF THE INVENTION

The present invention is directed to an apparatus and method for exposing an edge of a substrate, which substantially obviate one or more problems due to limitations and disadvantages of the related art.

An objective of the present invention is to provide an apparatus and method for exposing an edge of a substrate, in which an exposure time period for exposing the edge of the substrate is reduced.

Additional advantages, objectives, and features of the invention in part will be set forth in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In one embodiment, an apparatus is provided for exposing an edge of a substrate. The apparatus comprises a loading unit loading the substrate, and an edge exposure unit exposing the edge of the substrate loaded by the loading unit using each of a long side exposure unit and a short side exposure unit.

In another aspect of the present invention, a method for exposing an edge of a substrate includes mounting the substrate on a stage, and then exposing the edge of the substrate mounted on the stage using each of a long side exposure unit and a short side exposure unit.

In other aspect of the present invention, a method for exposing an edge of a substrate includes mounting the substrate on a stage, exposing both edges of a first side of the substrate in a state that the stage is stopped, exposing both edges of a second side of the substrate while moving the stage, and drawing the substrate of which both edges of the first and second sides have been exposed, from the stage and moving the drawn substrate to the outside.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 7A to 7J are sectional views illustrating exposure process steps of exposing an edge of a substrate in accordance with the first embodiment of the present invention;

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
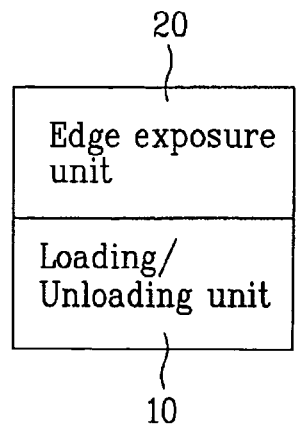
FIG. 1 is a block diagram illustrating a related art apparatus for exposing an edge of a substrate.
Figure 2:
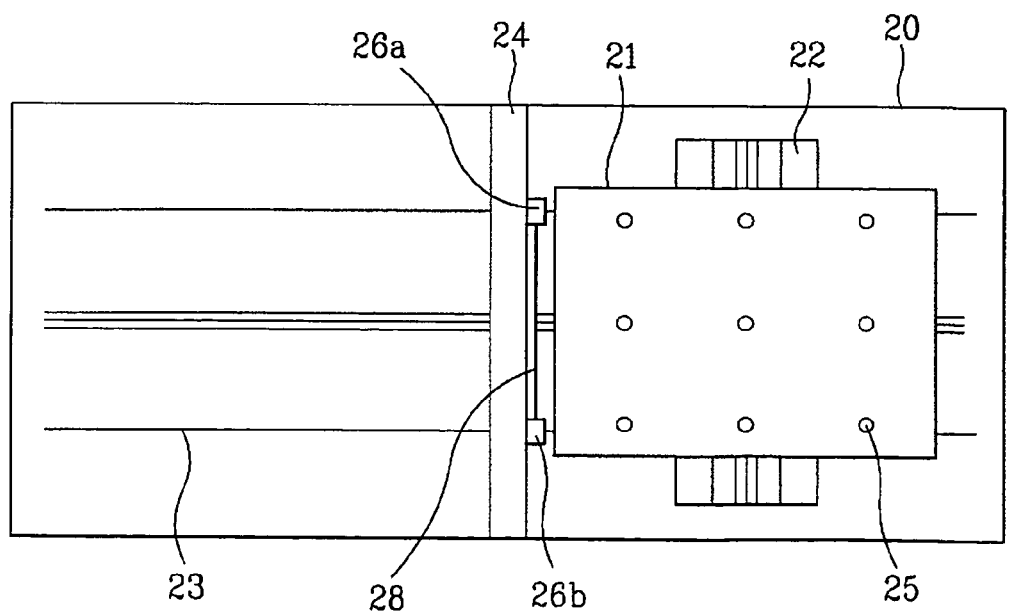
FIG. 2 illustrates a related art edge exposure unit shown in FIG. 1.
Figure 3A:
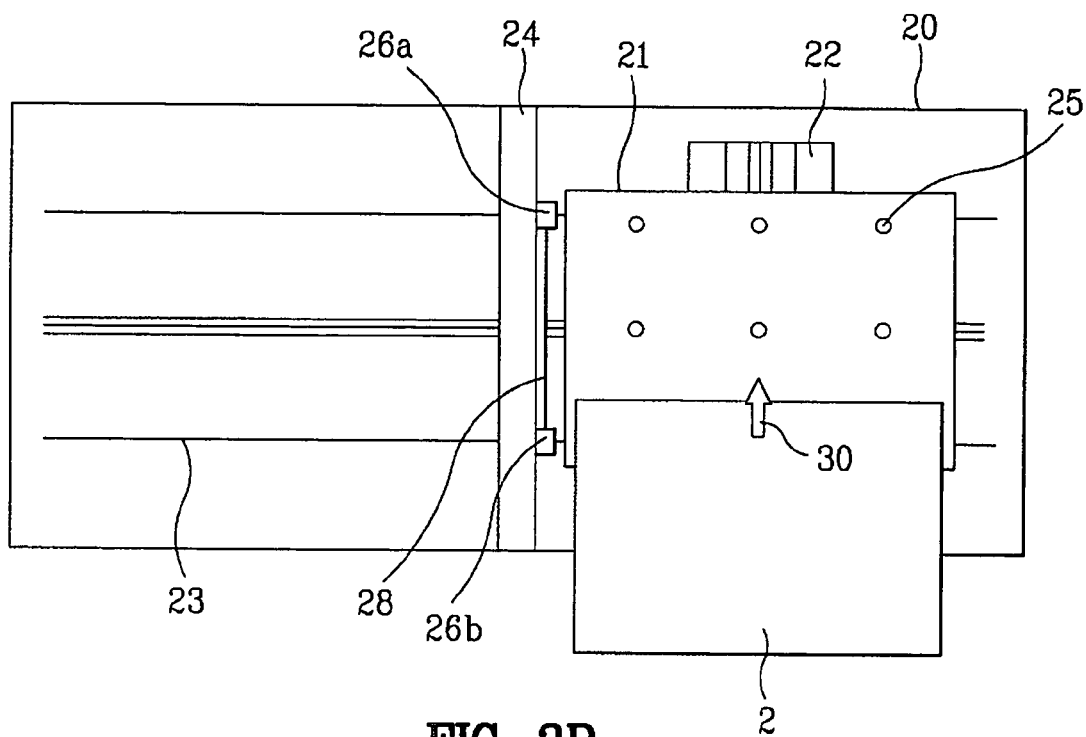
FIGS. 3A to 3G are sectional views illustrating exposure process steps of exposing an edge of a substrate using a related art edge exposure unit.
Figure 3B:
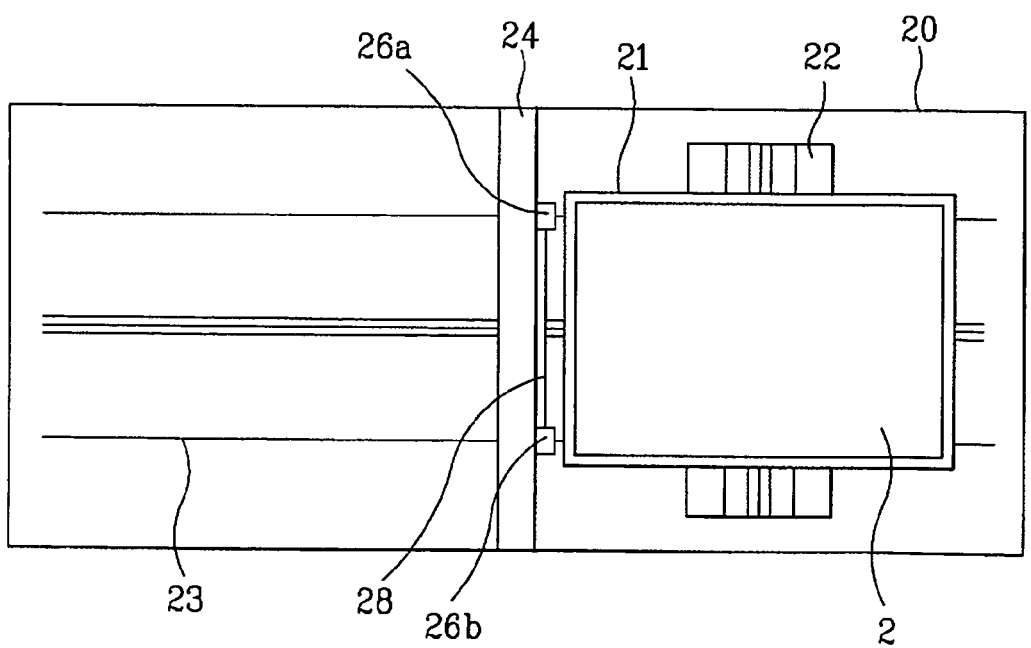
Figure 3C:
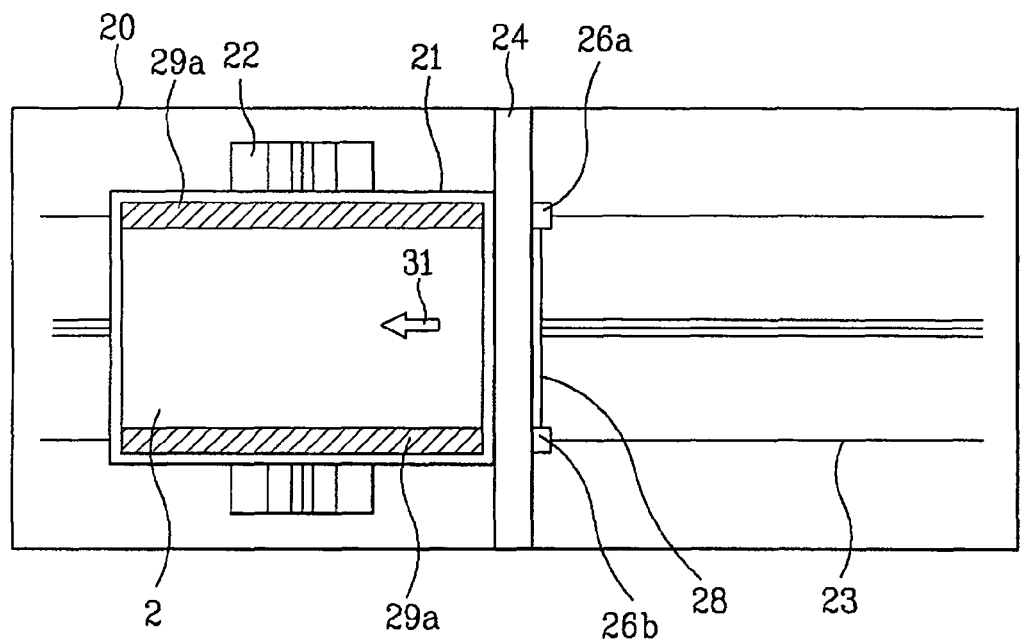
Figure 3D:
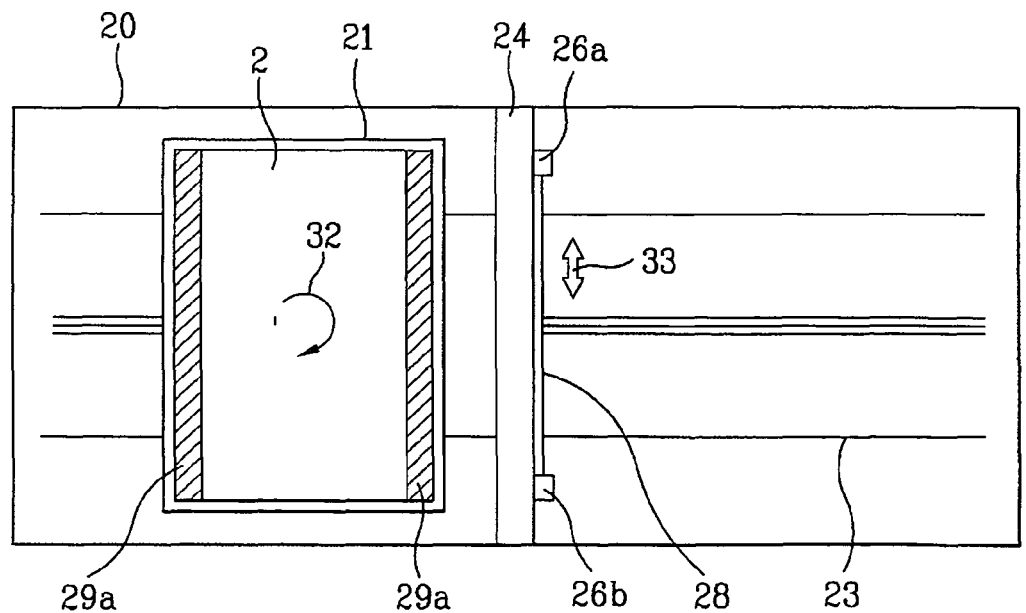
Figure 3E:
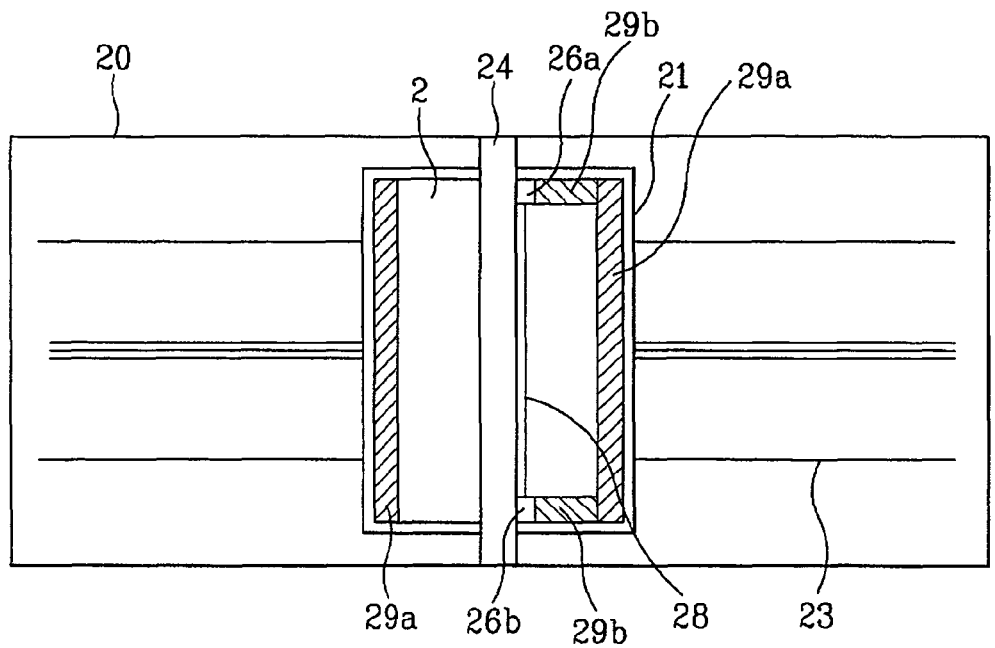
Figure 3F:
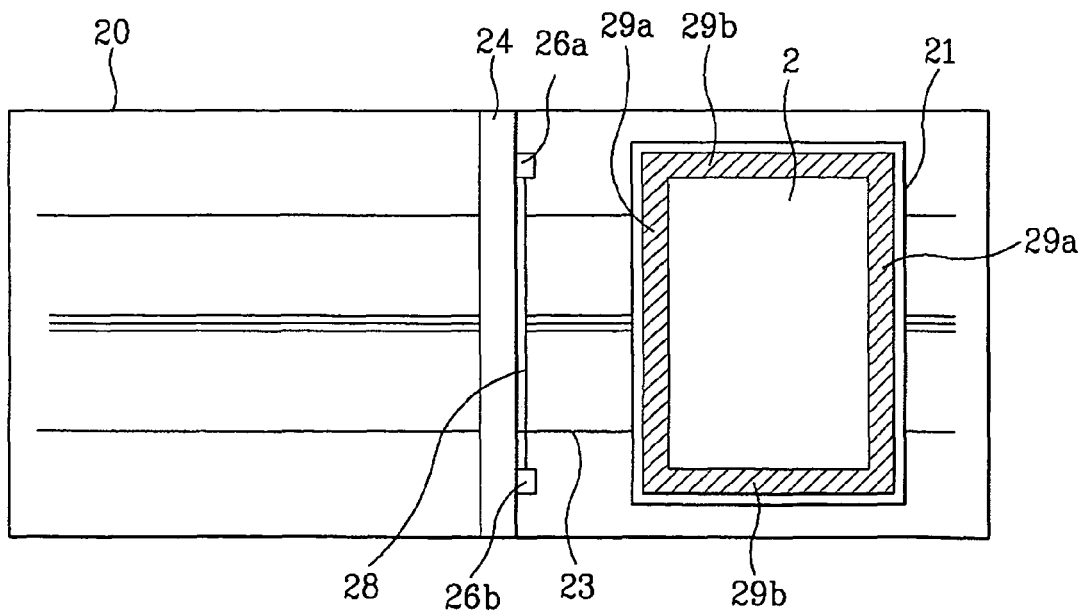
Figure 3G:
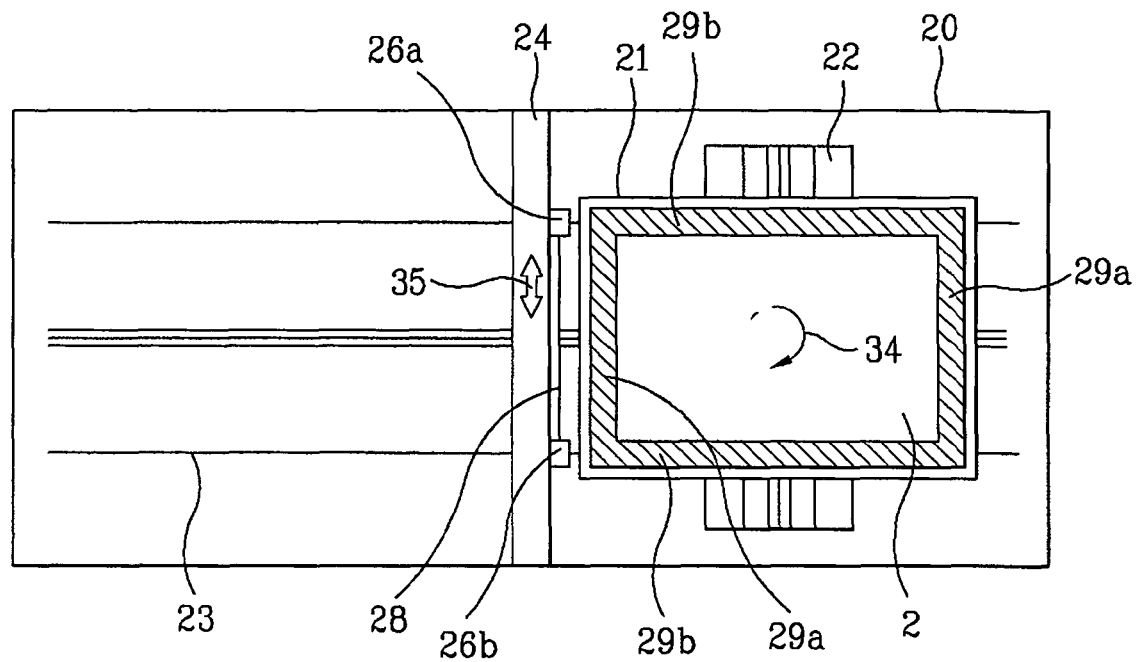
Figure 4:
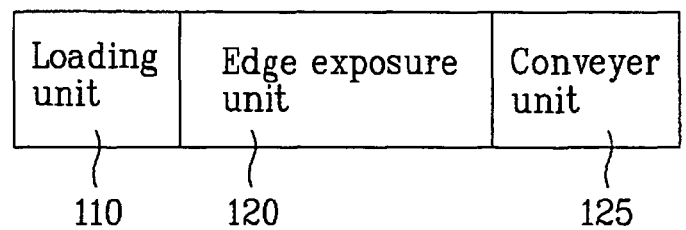
FIG. 4 is a block diagram illustrating an apparatus for exposing an edge of a substrate in accordance with the first embodiment of the present invention.

FIG. 4 is a block diagram illustrating an apparatus for exposing an edge of a substrate in accordance with the first embodiment of the present invention.

Referring to FIG. 4, the apparatus for exposing an edge of a substrate according to the first embodiment of the present invention includes a loading unit 110 loading the substrate, an edge exposure unit 120 exposing the edge of the substrate loaded by the loading unit 110, and a conveyer unit 125 moving the substrate whose edge has been exposed by the edge exposure unit 120.

The substrate may be a wafer for manufacture of a semiconductor device or a glass for manufacture of an image display device.

The loading unit 110 loads the substrate externally deposited with a photoresist into the edge exposure unit 120 using a robot arm.

The edge exposure unit 120 fixes the substrate loaded by the loading unit 110 and exposes long sides of the fixed substrate at a certain width using a long side exposure unit. Then, the edge exposure unit 120 exposes short sides of the exposed substrate at a certain width using a short side exposure unit.

The conveyer unit 125 moves the substrate whose edge has been exposed by the edge exposure unit 120 using a conveyer.

The apparatus for exposing the edge of the substrate in accordance with the first embodiment of the present invention can reduce an edge exposure process time period by arranging the loading unit 110, the edge exposure unit 120 and the conveyer unit 125 in an in-line type.

Figure 5A:
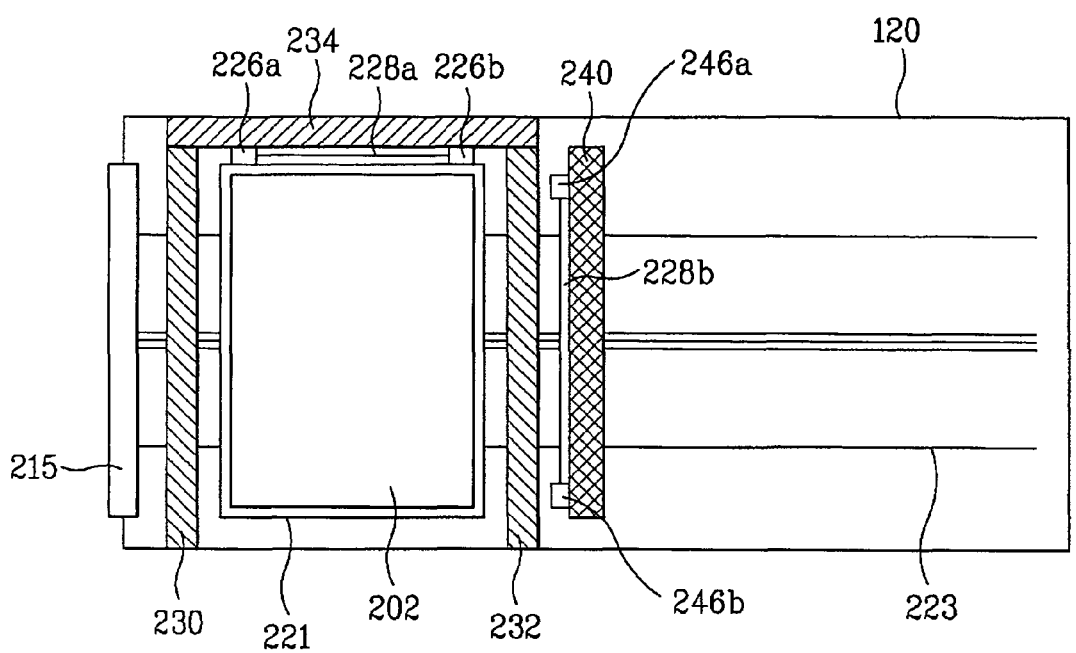
FIGS. 5A and 5B are sectional views illustrating an edge exposure unit shown in FIG. 4.
Figure 5B:
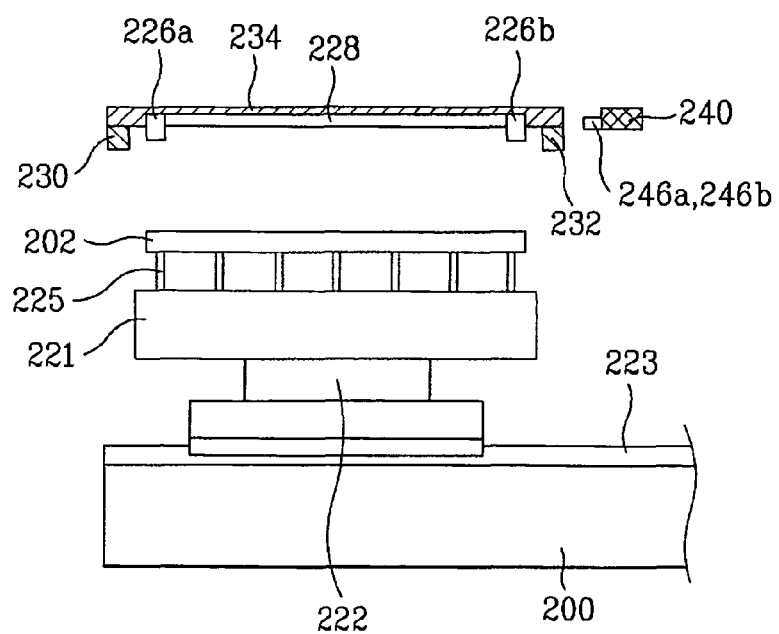

FIGS. 5A and 5B illustrate the edge exposure unit 120 shown in FIG. 4.

Referring to FIGS. 5A and 5B in connection with FIG. 4, the edge exposure unit 120 according to the first embodiment of the present invention includes a stage 221 supporting the substrate 202 loaded from the loading unit 110, a driving shaft 222 moving the stage 221 in a first direction (X axis), a rail 223 guiding the driving shaft 222 to move the driving shaft 222 to the first direction, a long side exposure unit exposing the long sides of the substrate 202 supported by the stage 221, and a short side exposure unit exposing the short sides of the substrate 202 moved by movement of the stage 221.

The stage 221 includes a plurality of lift pins 225 supporting and fixing the substrate 202 loaded from the loading unit 110. The lift pins 225 are ascended and descended by a driving device (not shown) to adsorb the substrate 202 under the vacuum state. The substrate 202 from the loading unit 110 is loaded onto the stage 221 through a port 215 provided to face one side of the stage 221.

The driving shaft 222 is linked to the driving device to move the stage 221 in the first direction (X axis) along the rail 223.

The rail 223 is provided on a support 200 and guides the driving shaft 222 to move the driving shaft 222 to the first direction (X axis).

The long side exposure unit includes first and second driving bars 230 and 232 arranged on the stage 221 to face each other, a moving bar 234 arranged between the first and second driving bars 230 and 232 to move to a second direction (Y axis), and first and second optical systems 226a and 226b arranged at a side of the moving bar 234 to correspond to the distance between the long sides of the substrate 202.

The first and second driving bars 230 and 232 are arranged on the stage 221 to vertically cross the rail 223 and move the moving bar 234 to the second direction (Y axis). At this time, the first driving bar 230 is arranged near the port 215 to which the substrate 202 is loaded by the loading unit 110 while the second driving bar 232 is arranged near the short side exposure unit.

The moving bar 234 is arranged to vertically cross the first and second driving bars 230 and 232 and faces the stage 221. The moving bar 234 is linked to driving of the first and second driving bars 230 and 232 to move to the second direction (Y axis). The moving bar 234 may be any one of LM (Linear Motion) rail and LM block of LM guide. Each of the first and second driving bars 230 and 232 may be the other one of LM rail and LM block of LM guide.

The first and second optical systems 226a and 226b are arranged in parallel at a side of the moving bar 234 and spaced apart from each other to correspond to the distance between the long sides of the substrate 202. Each of the first and second optical systems 226a and 226b irradiates light toward the long sides of the substrate 202 moved by the moving bar 234 and mounted on the stage 221. To this end, each of the first and second optical systems 226a and 226b may be laser modules irradiating laser or projection optical modules irradiating ultraviolet rays.

Meanwhile, the long side exposure unit may further include a distance controller 228a that controls the distance between the first and second optical systems 226a and 226b in accordance with the size of the substrate 202.

The short side exposure unit includes a support bar 240 arranged in parallel with the long side exposure unit, and third and fourth optical systems 246a and 246b arranged at a side of the support bar 240 to correspond to the distance between the short sides of the substrate 202.

The support bar 240 is arranged in parallel with the second driving bar 232 of the long side exposure unit to vertically cross the rail 223.

The third and fourth optical systems 246a and 246b are arranged in parallel at a side of the support bar 240 and spaced apart from each other to correspond to the distance between the short sides of the substrate 202. Each of the third and fourth optical systems 246a and 246b irradiates light toward the short sides of the substrate 202 mounted on the stage 221 moved to the first direction (X axis) along the rail 223. To this end, each of the third and fourth optical systems 246a and 246b may be laser modules irradiating laser or projection optical modules irradiating ultraviolet rays.

Meanwhile, the short side exposure unit may further include a distance controller 228b that controls the distance between the third and fourth optical systems 246a and 246b in accordance with the size of the substrate 202.

Figure 6:
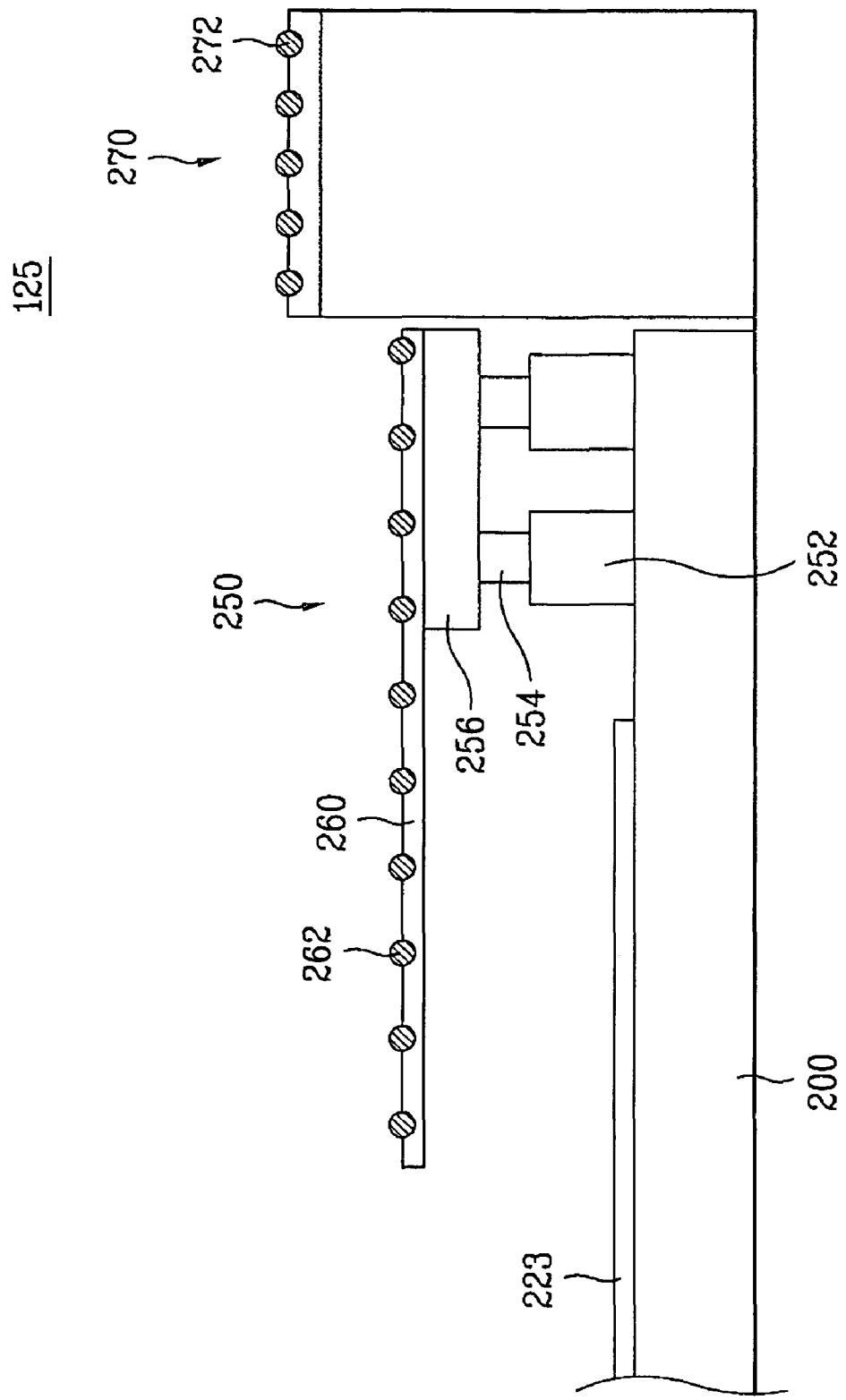
FIG. 6 illustrates a conveyer unit shown in FIG. 4.

FIG. 6 illustrates the conveyer unit 125 shown in FIG. 4.

Referring to FIG. 6 in connection with FIG. 4, the conveyer unit 125 includes a substrate drawing unit 250 drawing the substrate, whose edge has been exposed, from the edge exposure unit 120, and a substrate moving unit 270 moving the substrate drawn by the substrate drawing unit 250 to an external development unit (not shown).

The substrate drawing unit 250 includes at least one cylinder 252 arranged at an end of the support 220, a driving shaft 254 vertically driven by driving of the cylinder 252, a frame 256 arranged at an end of the driving shaft 254, and a roller driver arranged in parallel with the frame 256 to draw the substrate from the stage 221 of the edge exposure unit 120.

Each of the cylinders 252 is driven by a driving device (not shown) to ascend and descend the driving shaft 254.

The driving shaft 254 is linked to driving of the cylinder 252 to ascend and descend the frame 256.

The roller driver includes a plurality of guide wings 260 arranged in parallel at constant intervals, and a plurality of rollers 262 arranged in the respective guide wings 260 in parallel at constant intervals.

The guide wings 260 are arranged in parallel to be inserted between the stage 221 and the substrate. In other words, each of the guide wings 260 is inserted into a space between the lift pins ascended from the stage 221 at a certain height.

The rollers 262 are rotated by a driving motor (not shown) to move the substrate to the substrate moving unit 270. At this time, when the lift pins arranged in the stage 221 are ascended into the stage 221, the substrate is mounted on the rollers 262. Otherwise, when the driving shaft 254 is ascended by driving of the cylinder 252, the substrate is mounted on the rollers 262.

The substrate moving unit 270 is arranged near the substrate drawing unit 250 and includes a plurality of rollers 272 that moves the substrate moved by the roller driver to the external development unit. The substrate moving unit 270 may be a conveyer arranged in the external development unit to move the substrate during development.

FIGS. 7A to 7J are sectional views illustrating exposure process steps of exposing the edge of the substrate using the edge exposure unit according to the first embodiment of the present invention.

The exposure process steps of exposing the edge of the substrate using the edge exposure unit according to the first embodiment of the present invention will be described as follows.

First, when the substrate is loaded onto the stage 221 of the edge exposure unit 120 through the port (not shown) by the robot arm of the loading unit 110, as shown in FIG. 7A, the lift pins 225 arranged in the stage 221 are ascended to lift the substrate 202 mounted on the robot arm. When the substrate 202 is lifted by the lift pins 225, the robot arm returns to the loading unit 110.

Figure 7B:
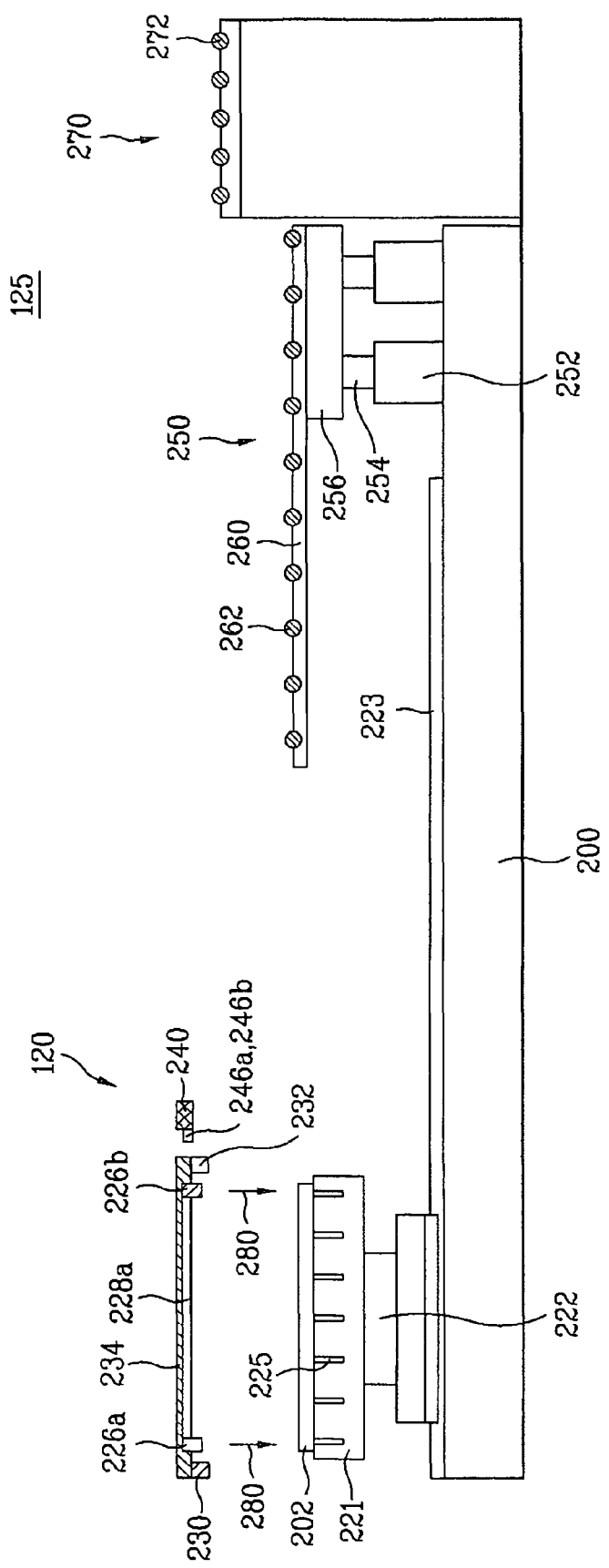

When the robot arm is taken out from the stage 221, as shown in FIG. 7B, the lift pins 225 descend so that the substrate 202 is mounted on the stage 221 and then aligned.

Subsequently, the moving bar 234 is slowly moved to the second direction (Y axis) by means of driving of the first and second driving units 230 and 232 and the moving bar 234. When the moving bar 234 moves near the substrate 202, the first and second optical systems 226a and 226b irradiate, as shown by arrow 280, light toward both edges of the long sides of the substrate 202 to expose the long sides of the substrate 202. At this time, the first and second optical systems 226a and 226b may be driven by a sensing signal from a sensor (not shown) that senses the position of the substrate 202.

Subsequently, when the long sides of the substrate 202 are completely exposed, the stage 221 is slowly moved, as shown by arrow 290, to the first direction (X axis), i.e., toward the conveyer unit 125 by driving of the driving shaft 222.

Figure 7C:
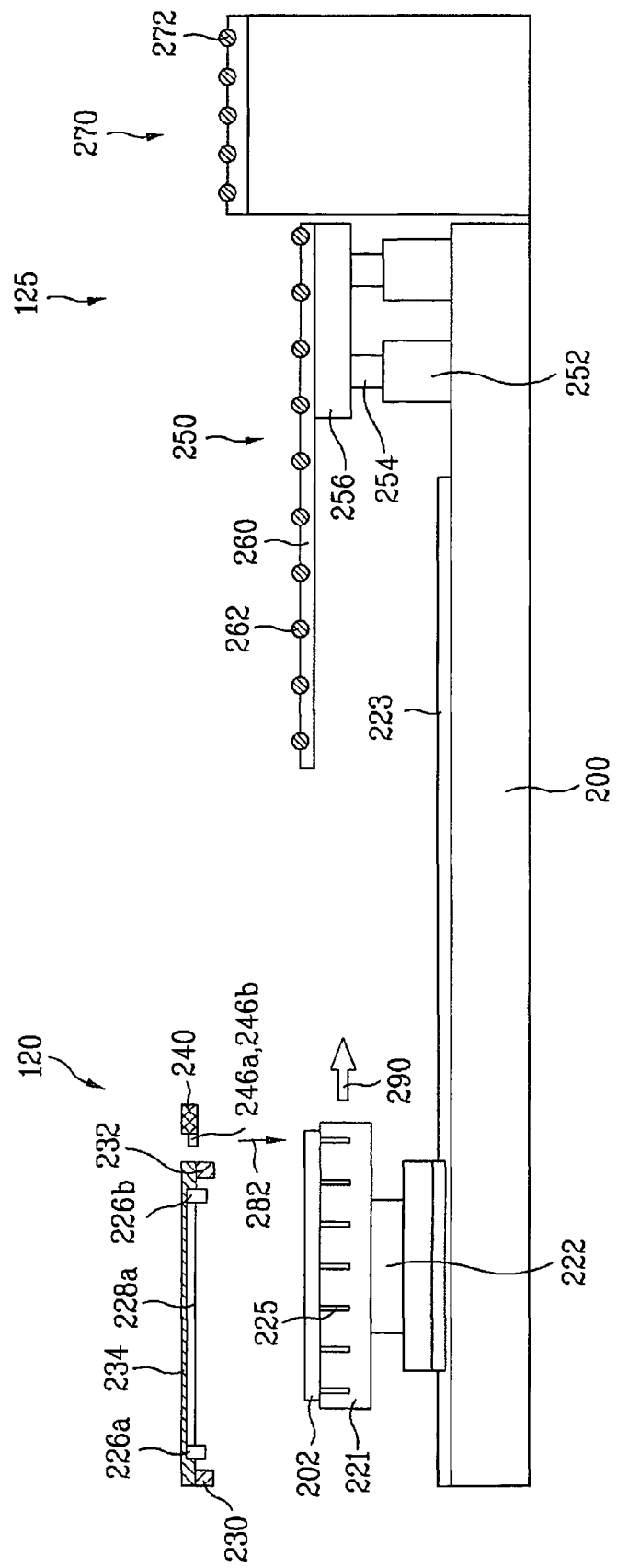

Next, when the substrate 202 mounted on the stage 221 moves near the short side exposure unit, as shown in FIGS. 7C and 7D, the third and fourth optical systems 246a and 246b irradiate, as shown by arrow 282, light toward both edges of the short sides of the substrate 202 mounted on the stage 221, which is moving along the rail 223, as shown by arrows 290 and 291, so as to expose the short sides of the substrate 202. At this time, the third and fourth optical systems 246a and 246b may be driven by a sensing signal from a sensor (not shown) that senses the position of the substrate 202.

Subsequently, when the short sides of the substrate 202 are completely exposed, as shown in FIG. 7E, the stage 221 continues to move, as shown by arrow 292, to the conveyer unit 125 along the rail 223. At this time, the lift pins 225 ascend before the stage 221 is near the guides 260 of the substrate drawing unit. Thus, the substrate 202 mounted on the stage 221 ascends at a certain height.

When the stage 221 is moved, as shown by arrow 293, to the drawing position of the substrate, as shown in FIG. 7F, the guide wings 260 are inserted into the space between the stage 221 and the substrate 202.

Figure 7G:
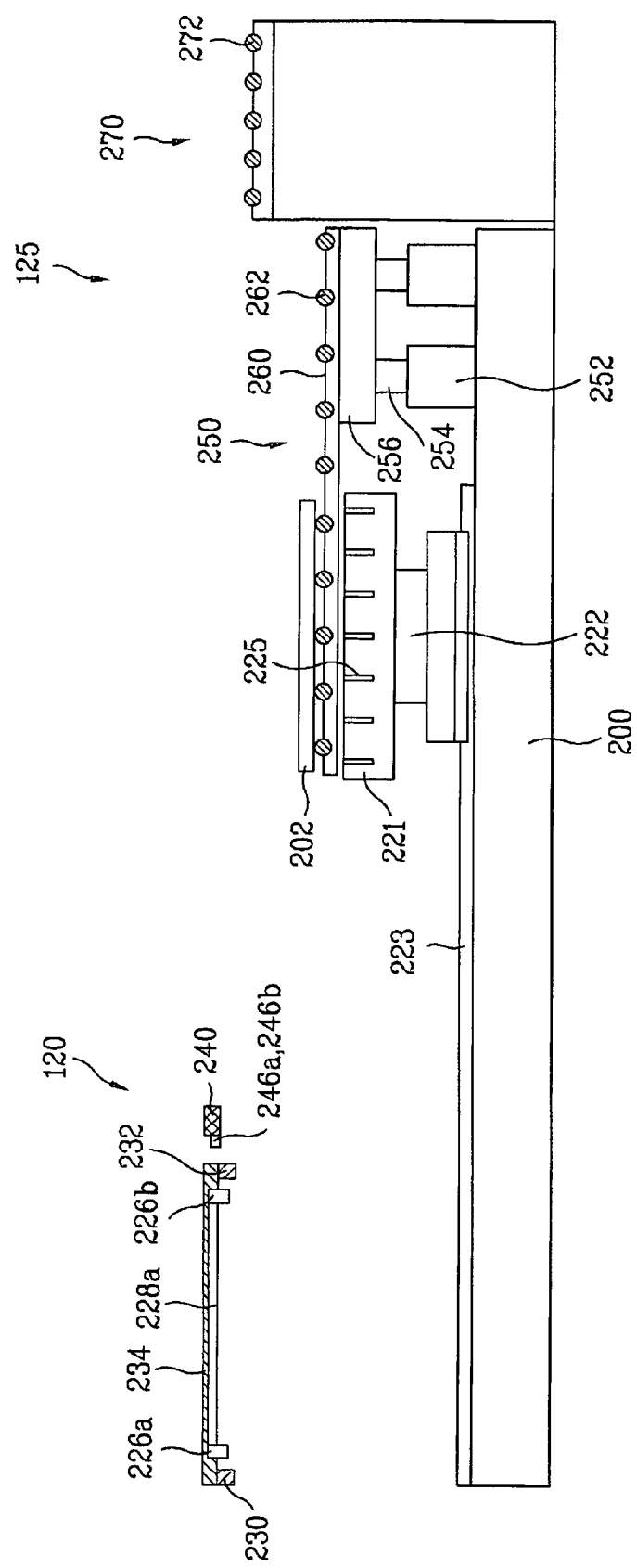

Next, as shown in FIG. 7G, as the lift pins 225 are descended into the stage 221, the substrate 202 supported by the lift pins 225 is mounted on the rollers 262 arranged in the guide wings 260. At the same time, the cylinder 252 is driven so that the guide wings 260 ascend at a certain height. In this case, the substrate 202 supported by the lift pins 225 may be mounted on the rollers 262 arranged in the guide wings 260.

Subsequently, as shown in FIG. 7H, to move the substrate 202 to the external development unit, the driving shaft 254 is linked to driving of the cylinder 252 and ascends, so that the guide wings 260 ascend. At this time, the guide wings 260 ascend, as shown by arrow 294, to the position corresponding to the rollers 272 arranged in the substrate drawing unit 270. At the same time, the stage 221 stopped at the drawing position of the substrate 202 is moved, as shown by arrow 295, to the first direction (X axis), i.e., the port 215 along the rail 223 and returns to the home position.

Figure 7I:
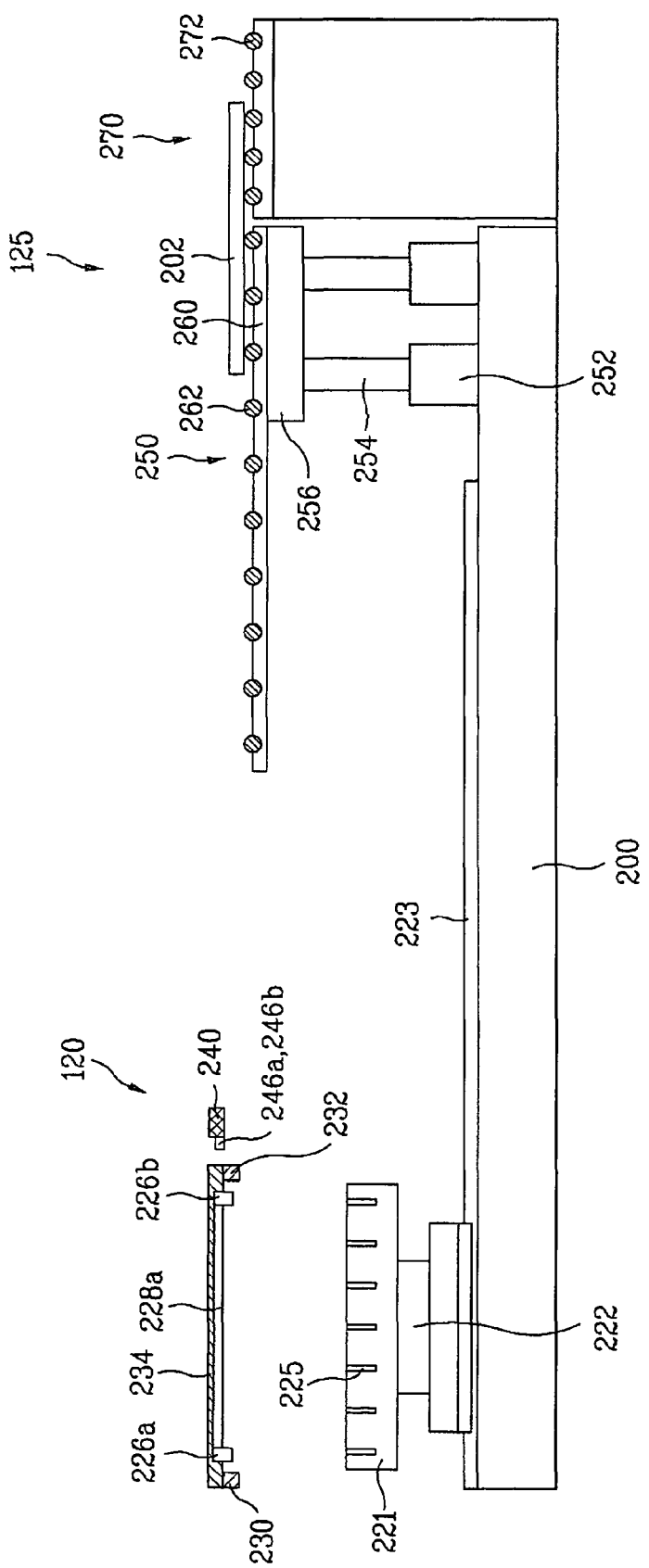

Afterwards, when the rollers 262 arranged in the guide wings 260 and the rollers 272 arranged in the substrate drawing unit 270 are aligned, as shown in FIG. 7I, the substrate 202 is moved to the external development unit as the rollers 262 and 272 rotate.

Figure 7J:
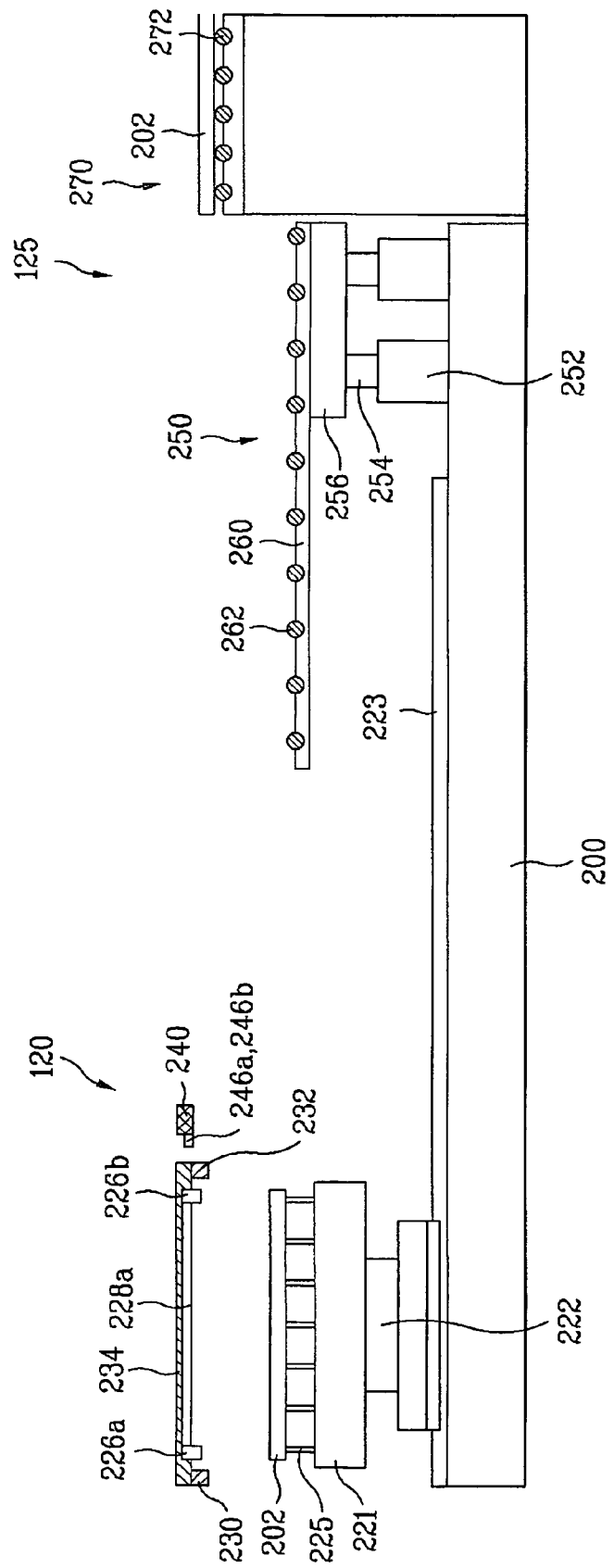

Then, when the substrate 202 is moved to the external development unit, as shown in FIG. 7J, a new substrate 202 is loaded onto the stage 221, which has returned to the home position, by the robot arm of the loading unit 110. While the substrate 202 is being loaded onto the stage, the guide wings 260 is descended to the position for drawing the substrate 202 by driving of the cylinder 252 and is in a standby state.

In the aforementioned apparatus and method for exposing the edge of the substrate according to the first embodiment of the present invention, as shown in FIGS. 7A to 7J, the edge of the substrate 202 is exposed in the order of loading of the substrate 202, exposure of the long sides of the stopped substrate 202, movement of the stage 221 and exposure of the short sides of the substrate 202 concurrently, and movement of the stage 221 and unloading of the substrate 202 concurrently.

Accordingly, in the aforementioned apparatus and method for exposing the edge of the substrate according to the first embodiment of the present invention, the substrate 202 is moved in an in-line type without any unnecessary standby time period of the substrate 202 such as rotation of the substrate 202 and reciprocating movement of the stage 221 to expose the edge of the substrate 202, thereby reducing the edge exposure time period. Therefore, it is possible to improve productivity. Also, since no rotation of the substrate 202 is required, it is possible to reduce the size of the apparatus.

Meanwhile, the aforementioned apparatus and method for exposing the edge of the substrate according to the first embodiment of the present invention may depend on the position between the loading unit 110 and the edge exposure unit 120.

Figure 8:
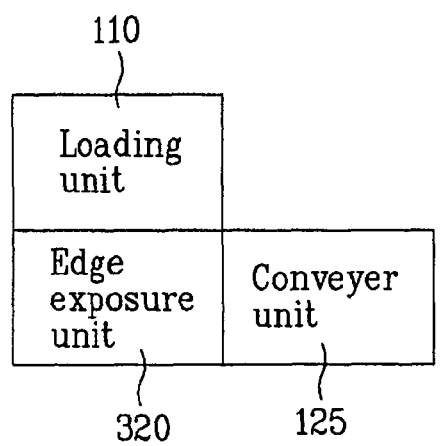
FIG. 8 is a block diagram illustrating an apparatus for exposing an edge of a substrate in accordance with the second embodiment of the present invention.

FIG. 8 is a block diagram illustrating an apparatus for exposing an edge of a substrate in accordance with the second embodiment of the present invention.

Referring to FIG. 8, the apparatus for exposing an edge of a substrate according to the second embodiment of the present invention includes a loading unit 110 loading the substrate, an edge exposure unit 320 arranged below the loading unit 110 to expose the edge of the substrate loaded by the loading unit 110 using a short side exposure unit and a long side exposure unit, and a conveyer unit 125 moving the substrate whose edge has been exposed by the edge exposure unit 320.

The apparatus for exposing the edge of the substrate in accordance with the second embodiment of the present invention can reduce an edge exposure process time period by arranging the edge exposure unit 320 and the conveyer unit 125 excluding the loading unit 110 in an in-line type.

Meanwhile, the apparatus for exposing an edge of a substrate in accordance with the second embodiment of the present invention has the same elements as those of the first embodiment excluding the edge exposure unit 320. Therefore, description of other elements excluding the edge exposure unit 320 will be replaced with the description according to the first embodiment.

Figure 9:
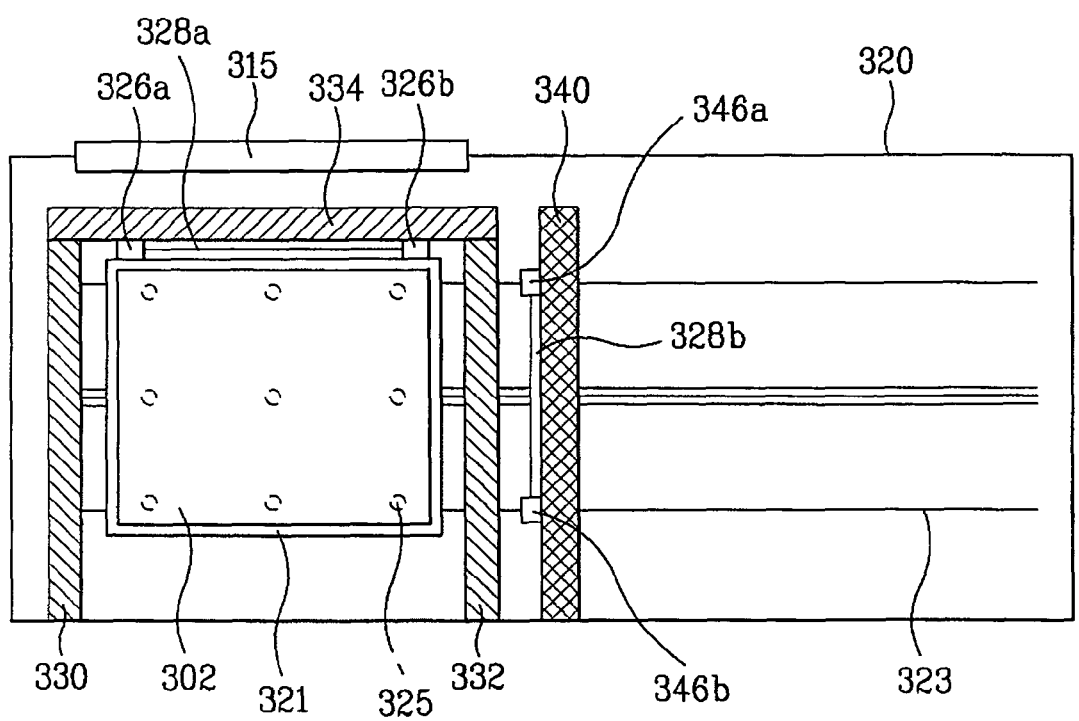
FIG. 9 is a sectional view illustrating an edge exposure unit shown in FIG. 8.

FIG. 9 illustrates the edge exposure unit 320 shown in FIG. 8.

Referring to FIG. 9 in connection with FIG. 8, the edge exposure unit 320 according to the second embodiment of the present invention includes a stage 321 supporting the substrate 302 loaded from the loading unit 110, a driving shaft (not shown) moving the stage 321 to a first direction (X axis), a rail 323 guiding the driving shaft to move the driving shaft to the first direction, a short side exposure unit exposing the short sides of the substrate 302 supported by the stage 321, and a long side exposure unit exposing the long sides of the substrate 302 moved along the movement of the stage 321.

The stage 321 includes a plurality of lift pins 325 supporting and fixing the substrate 302 loaded from the loading unit 110. The lift pins 325 are ascended and descended by a driving device (not shown) to adsorb to the substrate 302 under the vacuum state. The substrate 302 from the loading unit 110 is loaded onto the stage 321 through a port 315 provided to face an upper end of the stage 321.

The driving shaft is linked to the driving device to move the stage 321 in the first direction (X axis) along the rail 323.

The rail 323 guides the driving shaft to move the driving shaft to the first direction (X axis).

The short side exposure unit includes first and second driving bars 330 and 332 arranged on the stage 321 to face each other, a moving bar 334 arranged between the first and second driving bars 330 and 332 to move to a second direction (Y axis), and first and second optical systems 326a and 326b arranged at a side of the moving bar 334 to correspond to the distance between the short sides of the substrate 302.

The first and second driving bars 330 and 332 are arranged on the stage 321 to vertically cross the rail 323 and move the moving bar 334 to the second direction (Y axis). At this time, the first driving bar 330 is arranged to be vertical to the port 315 to which the substrate 302 is loaded by the loading unit 110, while the second driving bar 332 is arranged near the short side exposure unit.

The moving bar 334 is arranged to vertically cross the first and second driving bars 330 and 332 and faces the stage 321. The moving bar 334 is linked to driving of the first and second driving bars 330 and 332 to move to the second direction (Y axis). The moving bar 334 may be any one of LM rail and LM block of LM guide. Each of the first and second driving bars 330 and 332 may be other one of LM rail and LM block of LM guide.

The first and second optical systems 326a and 326b are arranged in parallel at a side of the moving bar 334 and spaced apart from each other to correspond to the distance between the short sides of the substrate 302. Each of the first and second optical systems 326a and 326b irradiates light toward the short sides of the substrate 302 moved by the moving bar 334 and mounted on the stage 321. To this end, each of the first and second optical systems 326a and 326b may be laser modules irradiating laser or projection optical modules irradiating ultraviolet rays.

Meanwhile, the short side exposure unit may further include a distance controller 328a that controls the distance between the first and second optical systems 326a and 326b in accordance with the size of the substrate 302.

The long side exposure unit includes a support bar 340 arranged in parallel with the long side exposure unit, and third and fourth optical systems 346a and 346b arranged at each side of the support bar 340 to correspond to the distance between the long sides of the substrate 302.

The support bar 340 is arranged in parallel with the second driving bar 332 of the short side exposure unit to vertically cross the rail 323.

The third and fourth optical systems 346a and 346b are arranged in parallel at each side of the support bar 340 and spaced apart from each other to correspond to the distance between the long sides of the substrate 302. Each of the third and fourth optical systems 346a and 346b irradiates light toward the long sides of the substrate 302 mounted on the stage 321 moved to the first direction (X axis) along the rail 323. To this end, each of the third and fourth optical systems 346a and 346b may be laser modules irradiating laser or projection optical modules irradiating ultraviolet rays.

Meanwhile, the long side exposure unit may further include a distance controller 328b that controls the distance between the third and fourth optical systems 346a and 346b in accordance with the size of the substrate 302.

FIGS. 10A to 10G are sectional views illustrating exposure process steps of exposing the edge of the substrate using the edge exposure unit according to the second embodiment of the present invention.

The exposure process steps of exposing the edge of the substrate using the edge exposure unit according to the second embodiment of the present invention will be described as follows.

Figure 10A:
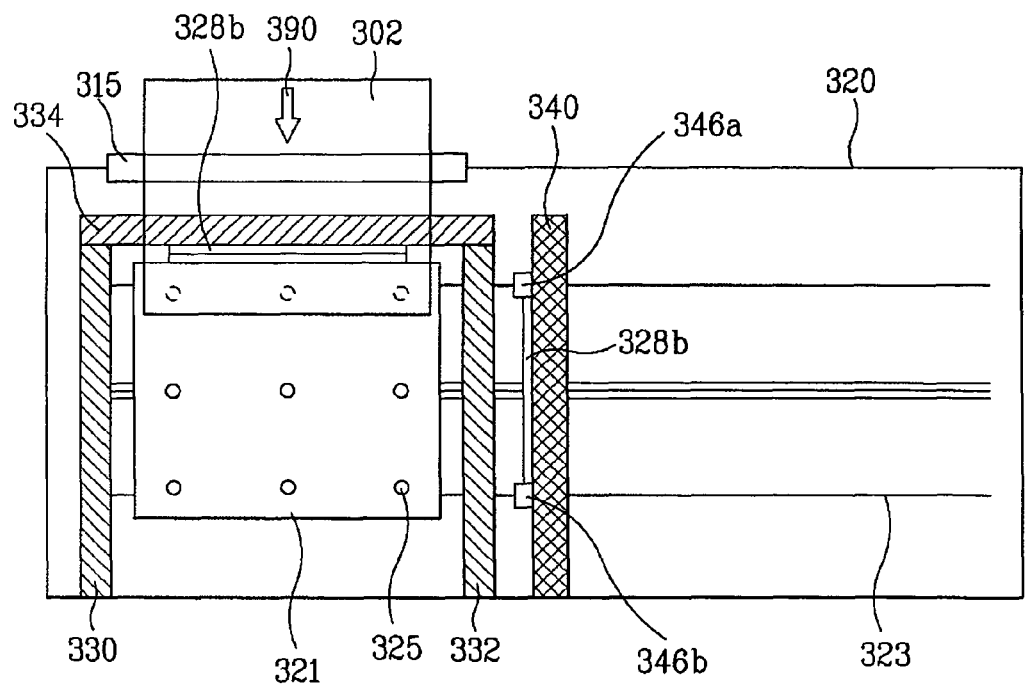
FIGS. 10A to 10G are sectional views illustrating exposure process steps of exposing an edge of a substrate in accordance with the second embodiment of the present invention.

First, as shown in FIG. 10A, the substrate 302 is loaded, as shown by arrow 390, onto the stage 321 of the edge exposure unit 320 through the port 315 by the robot arm of the loading unit 110.

Figure 10B:
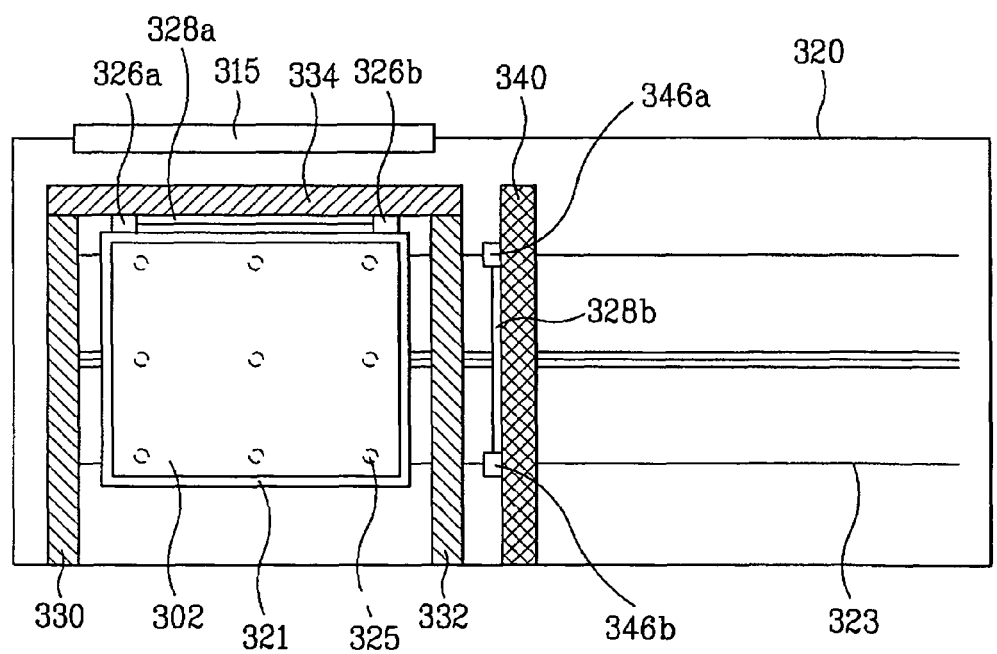

As shown in FIG. 10B, the lift pins 325 arranged in the stage 321 are ascended to lift the substrate 302 mounted on the robot arm. When the substrate 302 is lifted by the lift pins 325, the robot arm returns to the loading unit 110.

Subsequently, when the robot arm is taken out from the stage 321, the lift pins 325 descend so that the substrate 302 is mounted on the stage 321 and then aligned.

Figure 10C:
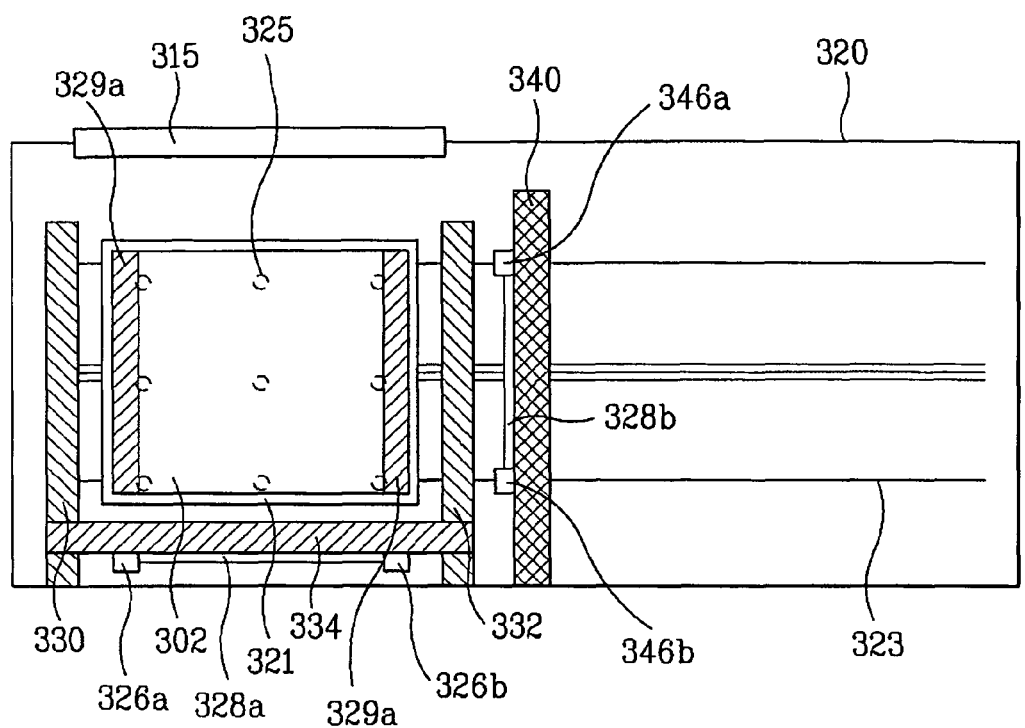

Then, the moving bar 334 is slowly moved to the second direction (Y axis) by means of driving of the first and second driving bars 330 and 332 and the moving bar 334. When the moving bar 334 moves near the substrate 302, as shown in FIG. 10C, the first and second optical systems 326a and 326b irradiate light toward both edges 329a of the short sides of the substrate 302 to expose the short sides of the substrate 302. At this time, the first and second optical systems 326a and 326b may be driven by a sensing signal from a sensor (not shown) that senses the position of the substrate 302.

Figure 10D:
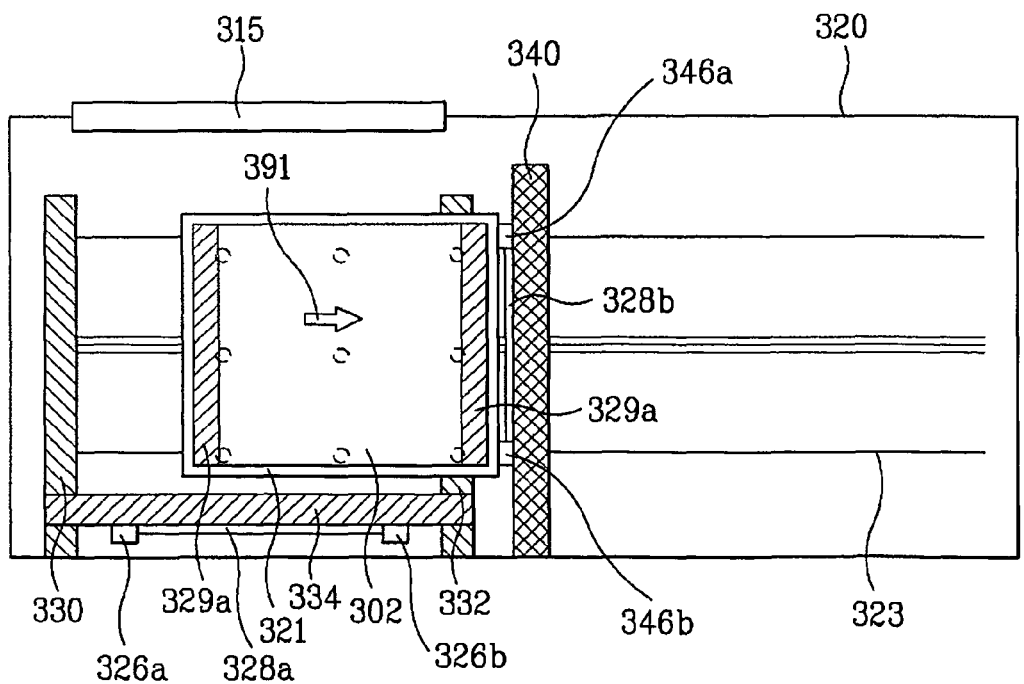

Subsequently, as shown in FIG. 10D, when the short sides of the substrate 302 are completely exposed, the stage 321 is slowly moved, as shown by arrow 391, to the first direction (X axis), i.e., toward the conveyer unit 125 along the rail 323.

Figure 10E:
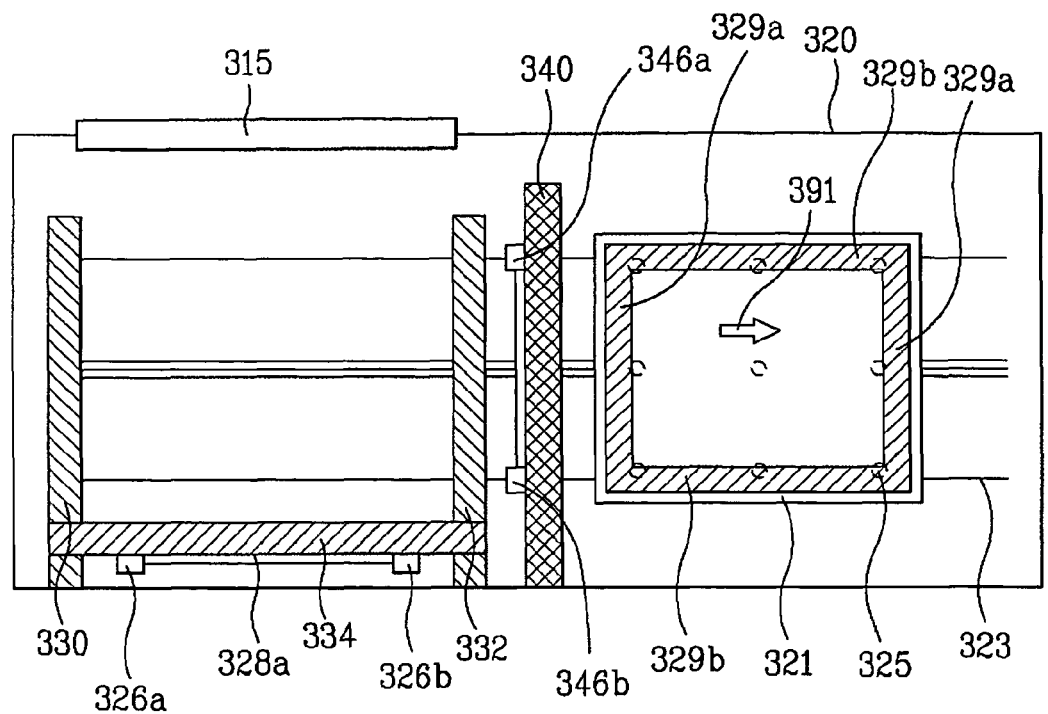

Next, when the substrate 302 mounted on the stage 321 moves near the long side exposure unit, as shown in FIG. 10E, the third and fourth optical systems 346a and 346b irradiate light toward both edges 329b of the long sides of the substrate 302 mounted on the stage 321, which is moving along the rail 323, as shown by arrow 391, so as to expose the long sides of the substrate 302. At this time, the third and fourth optical systems 346a and 346b may be driven by a sensing signal from a sensor (not shown) that senses the position of the substrate 302.

Subsequently, when the long sides of the substrate 302 are completely exposed, the stage 321 continues to move to the conveyer unit 125 along the rail 323. Thus, the stage 321 is moved to the drawing position of the substrate and then stopped.

Figure 10F:
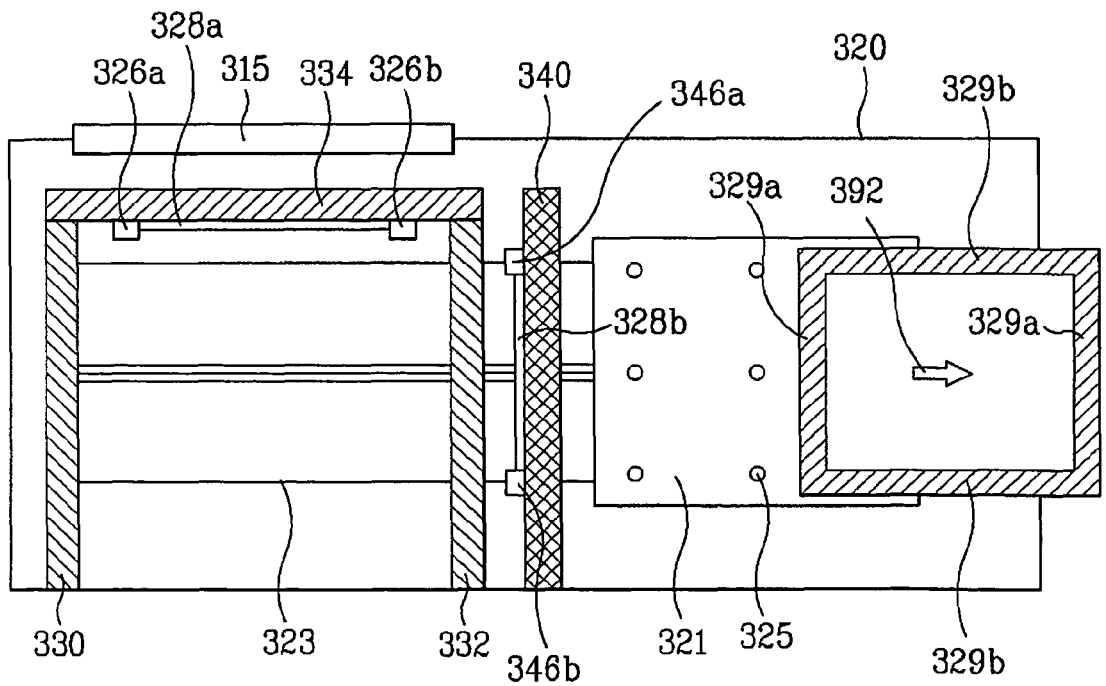

Afterwards, as shown in FIG. 10F, the substrate 302 mounted on the stage 321 stopped at the drawing position of the substrate is drawn from the stage 321 in accordance with the operation of the conveyer unit 125 shown in FIGS. 7F to 7I and then moved, as shown by arrow 392, to the external development unit. The operation of the conveyer unit 125 will be replaced with the description of FIGS. 7F to 7I.

Figure 10G:
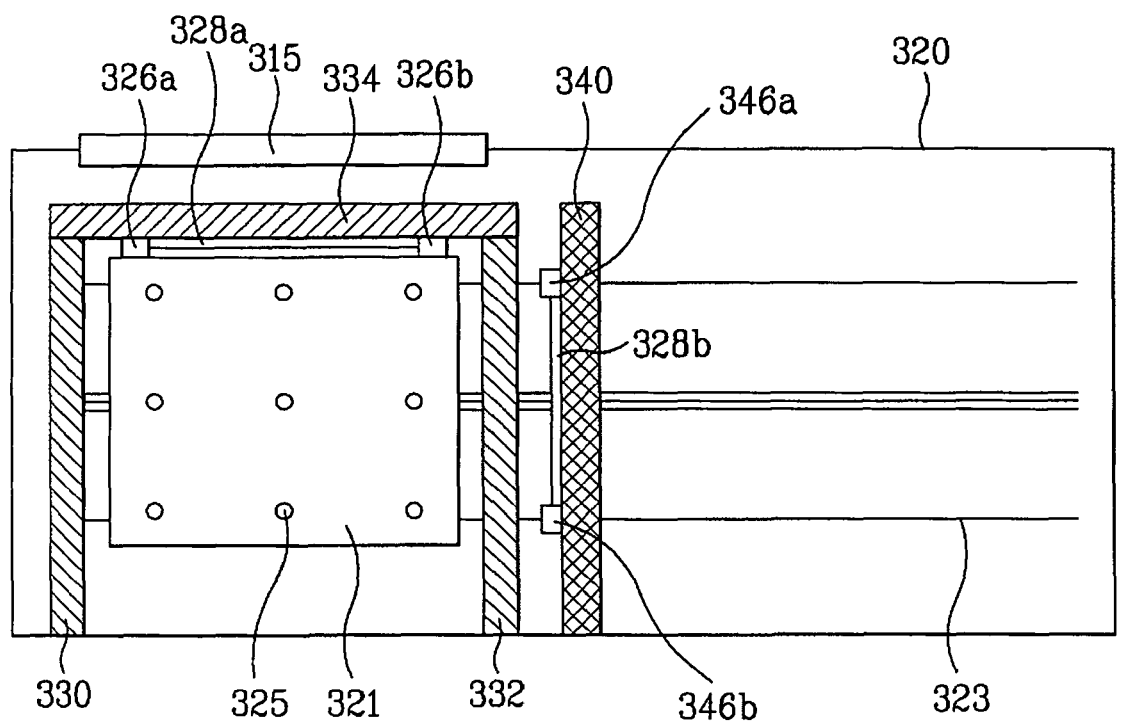

While the substrate 302 drawn from the stage 321 by the operation of the conveyer unit 125 is moving to the external development unit, as shown in FIG. 10G, the stage 321 is moved to the first direction (X axis), i.e., toward the port 325 along the rail 323 and returns to the home position.

In the aforementioned apparatus and method for exposing the edge of the substrate according to the second embodiment of the present invention, as shown in FIGS. 10A to 10G, the edge of the substrate 302 is exposed in the order of loading of the substrate 302, exposure of the short sides of the stopped substrate 302, movement of the stage 321 and exposure of the long sides of the substrate 302 concurrently, and movement of the stage 321, and unloading of the substrate 302.

Accordingly, in the aforementioned apparatus and method for exposing the edge of the substrate according to the second embodiment of the present invention, the substrate 302 is moved in an in-line type without any unnecessary standby time period of the substrate 302 such as rotation of the substrate 302 and reciprocating movement of the stage 321 to expose the edge of the substrate 302, thereby reducing the edge exposure time period. Therefore, it is possible to improve productivity. Also, since no rotation of the substrate 302 is required, it is possible to reduce the size of the apparatus.

As described above, the aforementioned apparatus and method for exposing the edge of the substrate according to the embodiments of the present invention have the following advantages.

Since the edge of the substrate is exposed using each of the long side exposure unit and the short side exposure unit, it is possible to reduce the edge exposure time period, thereby improving productivity.

In addition, since no rotation of the substrate is required, it is possible to reduce the size of the apparatus. Moreover, since the apparatus is provided in an in-line type, it is possible to easily draw the substrate using the conveyer.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for exposing an edge of a substrate comprising:
   a) mounting a substrate on a stage;
   b) exposing an edge of the substrate mounted on the stage using a long side exposure unit and a short side exposure unit, wherein the long side exposure unit includes first and second driving bars arranged on the stage to face each other, a moving bar arranged between the first and second driving bars, and first and second optical systems arranged at both sides of the moving bar,
   wherein the short side exposure unit includes a support bar, third and fourth optical systems arranged at both sides of the support bar;
   c) drawing the substrate, whose edge has been exposed, from the stage and moving the substrate to the outside of the stage using a conveyer;
   wherein the step c) includes:
   inserting a plurality of guide wings arranged in parallel at constant intervals between the substrate and the stage;
   driving at least one cylinder to ascend the plurality of guide wings; and
   driving a plurality of rollers arranged in the plurality of guide wings to move the substrate.

2. The method as set forth in claim 1, wherein the step b) includes:
   moving the long side exposure unit to a first direction along long sides of the substrate to expose edges of the long sides of the substrate;
   moving the stage to a second direction; and
   exposing edges of short sides of the substrate, moved to the second direction by the stage, using the short side exposure unit.

3. The method as set forth in claim 1, wherein the step b) includes:
   moving the short side exposure unit to a first direction along short sides of the substrate to expose edges of the short sides of the substrate;
   moving the stage to a second direction; and
   exposing edges of long sides of the substrate, moved to the second direction by the stage, using the long side exposure unit.

4. A method for exposing an edge of a substrate comprising:
   a) mounting a substrate on a stage;
   b) exposing both edges of a first side of the substrate when the stage is stopped using a long side exposure unit, wherein the long side exposure unit includes first and second driving bars arranged on the stage to face each other, a moving bar arranged between the first and second driving bars, and first and second optical systems arranged at both sides of the moving bar;
   c) exposing both edges of a second side of the substrate while moving the stage using a short side exposure unit, wherein the short side exposure unit includes a support bar, third and fourth optical systems arranged at both sides of the support bar; and
   d) drawing the substrate of which both edges of the first side and the second side have been exposed from the stage and moving the substrate to the outside of the stage;
   wherein the step d) includes:
   inserting a plurality of guide wings arranged in parallel at constant intervals between the substrate and the stage;
   driving at least one cylinder to ascend the plurality of guide wings; and
   driving a plurality of rollers arranged in the plurality of guide wings to move the substrate.

* * * * *